US009356153B2

(12) United States Patent
Khang et al.

(10) Patent No.: US 9,356,153 B2
(45) Date of Patent: May 31, 2016

(54) THIN FILM TRANSISTOR, DISPLAY PANEL HAVING THE SAME AND METHOD OF MANUFACTURING THE SAME

(71) Applicant: SAMSUNG DISPLAY CO., LTD., Yongin, Gyeonggi-Do (KR)

(72) Inventors: Yoon-Ho Khang, Yongin-Si (KR); Dong-Jo Kim, Yongin-Si (KR); Su-Hyoung Kang, Bucheon-Si (KR); Yong-Su Lee, Hwaseong-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/452,261

(22) Filed: Aug. 5, 2014

(65) Prior Publication Data

US 2015/0108481 A1    Apr. 23, 2015

(30) Foreign Application Priority Data

Oct. 18, 2013    (KR) .................. 10-2013-0124353

(51) Int. Cl.
*H01L 29/786* (2006.01)
*H01L 21/336* (2006.01)

(52) U.S. Cl.
CPC ...... *H01L 29/7869* (2013.01); *H01L 29/78645* (2013.01); *H01L 29/78648* (2013.01); *H01L 29/78696* (2013.01)

(58) Field of Classification Search
CPC .............. H01L 29/78645; H01L 29/78648; H01L 29/6675; H01L 29/7869; H01L 29/78696
USPC ......... 257/59, 72, E29.273; 438/34, 157, 158
See application file for complete search history.

(56) References Cited

U.S. PATENT DOCUMENTS

| 6,245,602 B1* | 6/2001 | Ho ................... H01L 29/66757 257/E21.413 |
| 6,403,409 B1 | 6/2002 | You |
| 6,414,297 B1* | 7/2002 | Sasaki ................. G06F 3/0421 250/214 R |
| 7,977,151 B2 | 7/2011 | Shieh et al. |
| 8,237,878 B2 | 8/2012 | Shim et al. |
| 8,778,745 B2* | 7/2014 | Komatsu ............ C23C 16/0272 257/E21.09 |

(Continued)

FOREIGN PATENT DOCUMENTS

| JP | 3563433 | 6/2004 |
| JP | 2005-072144 | 3/2005 |

(Continued)

OTHER PUBLICATIONS

English Abstract for Publication No. 07-263741 (for JP 3563433).

(Continued)

*Primary Examiner* — Marvin Payen
*Assistant Examiner* — Jeremy Joy
(74) *Attorney, Agent, or Firm* — F. Chau & Associates, LLC

(57) ABSTRACT

A thin film transistor includes a bottom gate electrode, a top gate electrode and an active pattern. The top gate electrode includes a transparent conductive material and overlaps with the bottom gate electrode. A boundary of the bottom gate electrode and a boundary of the top gate electrode are coincident with each other in a cross-sectional view. The active pattern includes a source portion, a drain portion and a channel portion disposed between the source portion and the drain portion. The channel portion overlaps with the bottom gate electrode and the top gate electrode.

19 Claims, 25 Drawing Sheets

(56) References Cited

U.S. PATENT DOCUMENTS

| | | | |
|---|---|---|---|
| 8,829,522 B2* | 9/2014 | Miyairi | H01L 29/66765 257/57 |
| 2001/0030324 A1* | 10/2001 | Morikawa | H01L 27/14609 257/59 |
| 2002/0014530 A1* | 2/2002 | Iihama | H01L 27/14601 235/454 |
| 2004/0246765 A1* | 12/2004 | Kato | G11C 11/404 365/149 |
| 2010/0133541 A1* | 6/2010 | Uchida | H01L 27/1214 257/59 |
| 2011/0024755 A1* | 2/2011 | Korenari | H01L 27/1214 257/59 |
| 2012/0146713 A1* | 6/2012 | Kim | H01L 29/41733 327/530 |
| 2013/0309808 A1* | 11/2013 | Zhang | H01L 29/78648 438/104 |
| 2013/0313621 A1* | 11/2013 | Yamada | H01L 27/146 257/292 |
| 2014/0042437 A1* | 2/2014 | Yamazaki | H01L 29/78693 257/43 |

FOREIGN PATENT DOCUMENTS

| | | |
|---|---|---|
| KR | 10-0516677 | 9/2005 |
| KR | 10-2012-0070709 | 7/2012 |

OTHER PUBLICATIONS

English Abstract for Publication No. 10-2002-0058280 (for KR 10-0516677).

* cited by examiner

THIN FILM TRANSISTOR, DISPLAY PANEL HAVING THE SAME AND METHOD OF MANUFACTURING THE SAME

This application claims priority under 35 U.S.C. §119 to Korean Patent Application No. 10-2013-0124353, filed on Oct. 18, 2013, the disclosure of which is hereby incorporated by reference herein in its entirety.

TECHNICAL FIELD

Exemplary embodiments of the invention relate to a thin film transistor, a display panel having the thin film transistor, a method of manufacturing the thin film transistor and a method of manufacturing the display panel.

More particularly, exemplary embodiments of the invention relate to a thin film transistor for a display apparatus, a display panel having the thin film transistor, a method of manufacturing the thin film transistor and a method of manufacturing the display panel

DISCUSSION OF THE RELATED ART

Generally, a liquid crystal display (LCD) apparatus has various beneficial characteristics such as, for example, thin thickness, lightweight, low power consumption, etc. Thus, the LCD apparatus has been widely used, for example, in a monitor, a note personal computer, a cellular phone, etc. The LCD apparatus may include an LCD panel displaying an image by using an optical transmissivity of liquid crystals and a backlight assembly disposed under the LCD panel to provide light to the LCD panel.

The liquid crystal display panel may include, for example, an array substrate having a signal line, a thin film transistor and a pixel electrode, an opposite substrate facing the array substrate and having a common electrode, and a liquid crystal layer disposed between the array substrate and the opposite substrate. Generally, a vertical electric field is formed using, for example, the common electrode and the pixel electrode, and the vertical electric field drives a liquid crystal layer.

A thin film transistor may have various structures to increase switching characteristics. For example, the thin film transistor may have a double gate structure. In this case, effective mobility may be increased, but a parasitic capacitance which is caused by overlapping of source and drain electrode and gate electrodes may be increased. In addition, the display quality of a display panel having the thin film transistor having the double gate structure may be degraded.

SUMMARY

Exemplary embodiments of the invention provide a thin film transistor capable of decreasing a parasitic capacitance and increasing an effective mobility of the thin film transistor.

Exemplary embodiments of the invention also provide a display panel including the thin film transistor.

Exemplary embodiments of the invention also provide a method of manufacturing the thin film transistor.

Exemplary embodiments of the invention also provide a method of manufacturing the display panel.

According to an exemplary embodiment of the invention, a thin film transistor includes a bottom gate electrode, a top gate electrode and an active pattern. The top gate electrode includes a transparent conductive material and overlaps with the bottom gate electrode. A boundary of the bottom gate electrode and a boundary of the top gate electrode are coincident with each other in a cross-sectional view. The active pattern includes a source portion, a drain portion and a channel portion disposed between the source portion and the drain portion. The channel portion overlaps with the bottom gate electrode and the top gate electrode.

In an exemplary embodiment, the bottom gate electrode may include an opaque metal.

In an exemplary embodiment, the active pattern may be transparent.

In an exemplary embodiment, the active pattern may include an oxide semiconductor. The source and drain portions may be deoxidized portions of the oxide semiconductor.

In an exemplary embodiment, thickness of the active pattern may be about 500 Å.

In an exemplary embodiment, the active pattern may include an amorphous silicon. A thickness of the active pattern may be about 100 Å.

In an exemplary embodiment, the thin film transistor may further include a substrate on which the bottom gate electrode is disposed, a first insulation layer disposed between the bottom gate electrode and the active pattern and configured to insulate the bottom gate electrode, and a second insulation pattern disposed between the active pattern and the top gate electrode and configured to insulate the top gate electrode.

In an exemplary embodiment, a boundary shape of the second insulation pattern may be substantially the same as a boundary shape of the top gate electrode in a plan view.

In an exemplary embodiment, a boundary line between the channel portion and the source portion and a boundary line between the channel portion and the drain portion may be substantially coincident with boundaries of the bottom gate electrode.

In an exemplary embodiment, a deviation of a skew may be less than about 0.5 nm. The skew may be defined as a miss-align distance between the bottom gate electrode and the top gate electrode. The deviation of the skew may be defined as a value of a smallest skew subtracted from a biggest skew.

According to an exemplary embodiment of the invention, a display panel includes a gate line, a data line crossing the gate line, a first electrode disposed in a pixel area which is defined by the gate and data lines, and a thin film transistor electrically connected to the gate line, the data line and the first electrode. The thin film transistor includes a bottom gate electrode electrically connected to the gate line, a top gate electrode and an active pattern. The top gate electrode includes a transparent conductive material and overlaps with the bottom gate electrode. A boundary of the bottom gate electrode and a boundary of the top gate electrode are coincident with each other in a cross-sectional view. The active pattern includes a source portion electrically connected to data line, a drain portion electrically connected to the first electrode and a channel portion disposed between the source portion and the drain portion. The channel portion overlaps with the bottom gate electrode and the top gate electrode.

In an exemplary embodiment, the bottom gate electrode may include an opaque metal. The active pattern may be transparent and includes an oxide semiconductor. The source and drain portions of the active pattern may be deoxidized portions of the oxide semiconductor.

In an exemplary embodiment, the display panel may further include a substrate on which the gate line and the bottom gate electrode are disposed, a first insulation layer disposed between the bottom gate electrode and the active pattern configured to insulate the bottom gate electrode, a second insulation pattern disposed between the active pattern and the top gate electrode and configured to insulate the top gate electrode, a third insulation layer disposed on the thin film transistor and configured to insulate thin film transistor, and a fourth insulation layer disposed on the third insulation layer. The data line may be disposed between the third insulation layer and the fourth insulation layer.

In an exemplary embodiment, the display panel may further include a connecting electrode which electrically connects the top gate electrode to the gate line. The connecting electrode may include a same material as the first electrode.

In an exemplary embodiment, a first contact hole may be formed through the third insulation layer. A second contact hole may be disposed through the third insulation layer and the fourth insulation layer. A third contact hole may be disposed through the third insulation layer and the fourth insulation layer. A fourth contact hole may be disposed through the first insulation layer, the third insulation layer and the fourth insulation layer. The data line may be electrically connected to the source portion of the active pattern through the first contact hole. The first electrode may be electrically connected to the drain portion of the active pattern through the second contact hole. The connecting electrode may be electrically connected to the top gate electrode through the third contact hole, and electrically connected to the gate line through the fourth contact hole.

In an exemplary embodiment, a deviation of a skew may be less than about 0.5 nm. The skew may be defined as a missalign distance between the bottom gate electrode and the top gate electrode. The deviation of the skew may be defined as a value of a smallest skew subtracted from a biggest skew.

According to an exemplary embodiment of the invention, in a method of manufacturing a thin film transistor, a bottom gate electrode is formed on a substrate, and the bottom gate electrode includes an opaque metal. A first insulation layer is formed on the substrate on which the bottom gate electrode is formed. An active layer, a second insulation layer and a top gate layer are sequentially formed on the first insulation layer. The top gate layer includes a transparent conductive material. A photoresist pattern corresponding to the bottom gate electrode is formed by coating a photoresist composition on the top gate layer, and applying a back exposure to the photoresist composition. The back exposure includes irradiating light in a direction from the substrate to the photoresist composition. A top gate electrode and a second insulation pattern are formed by etching a portion of the top gate layer and a portion of the second insulation layer which are not covered by the photoresist pattern. Moreover, portions of the active layer are exposed by the forming of the top gate electrode and the second insulation pattern.

In an exemplary embodiment, the active layer may include an oxide semiconductor. The method may further include forming a source portion and a drain portion by deoxidizing the portions of the active layer which are exposed.

According to an exemplary embodiment of the invention, in a method of manufacturing a display panel, a bottom gate electrode and a gate line are formed on a substrate. A first insulation layer is formed on the substrate on which the bottom gate electrode and the gate line are formed. An active layer, a second insulation layer and a top gate layer are sequentially formed on the first insulation layer. The active layer includes an oxide semiconductor. The top gate layer includes a transparent conductive material. A first photoresist pattern corresponding to an active pattern is formed on the top gate layer. A preliminary top gate electrode, a preliminary second insulation pattern and an active pattern are formed by etching the top gate layer, the second insulation layer and the active layer using the first photoresist pattern. A second photoresist pattern corresponding to the bottom gate electrode is formed by coating a photoresist composition on the top gate layer, and applying a back exposure to the photoresist composition. The back exposure includes irradiating light in a direction from the substrate to the photoresist composition. A top gate electrode and a second insulation pattern are formed by etching a portion of the preliminary top gate electrode and a portion of the preliminary second insulation pattern which are not covered by the second photoresist pattern. Moreover, portions of the active pattern are exposed by the forming of the top gate electrode and the second insulation pattern. A source portion and a drain portion are formed by deoxidizing the portions of the active pattern which are exposed. A third insulation layer is formed on the first insulation layer on which the top gate electrode and the active pattern are formed.

In an exemplary embodiment, a first contact hole may be formed through the third insulation layer. The first contact hole may expose the source portion of the active pattern. A data line may be formed on the third insulation layer. The data line may be electrically connected to the source electrode of the active pattern through the first contact hole. A fourth insulation layer may be formed on the third insulation layer on which the data line is formed. A second contact hole may be formed through the fourth insulation layer and the third insulation layer. The second contact hole may expose the drain portion of the active pattern. A third contact hole is formed through the fourth and third insulation layers. The third contact hole may expose the top gate electrode. A fourth contact hole may be formed through the fourth insulation layer, the third insulation layer and the first insulation layer. The fourth contact hole may expose the gate line. A first electrode and a connecting electrode may be formed on the fourth insulation layer. The first electrode may be electrically connected to the drain portion of the active pattern through the second contact hole. The connecting electrode may be electrically connected to the top gate electrode through the third contact hole, and may be electrically connected to the gate line through the fourth contact hole.

In accordance with an exemplary embodiment of the invention, a display panel is provided. The display panel includes an array substrate including a gate line, a data line crossing the gate line, a first electrode including a transparent conductive material and disposed in a pixel area which is defined by the gate line and the data line and a thin film transistor electrically connected to the gate line, the data line and the first electrode. The thin film transistor includes a bottom gate electrode electrically connected to the gate line, a top gate electrode comprising a transparent conductive material and overlapping with the bottom gate electrode, in which a boundary of the bottom gate electrode and a boundary of the top gate electrode are coincident with each other in a cross-sectional view, and an active pattern including a source portion electrically connected to the data line, a drain portion electrically connected to the first electrode and a channel portion disposed between the source portion and the drain portion. The channel portion overlaps with the bottom gate electrode and the top gate electrode. The source portion and drain portion are each adjacent to the channel portion and are each on a same plane as the channel portion, and the top gate electrode and the bottom gate electrode do not overlap with the source portion and/or the drain portion.

The display panel further includes a first insulation layer covering and insulating the bottom gate electrode, in which the active pattern is disposed on an upper surface of the first insulation layer, and a second insulation pattern disposed on the channel portion of the active pattern, in which the top gate electrode is disposed on the second insulation pattern, and in which the second insulation pattern and the top gate electrode have same shape as each other in a plan view.

In addition, the display panel further includes a third insulation layer disposed on the top gate electrode and the active pattern, in which the third insulation layer covers and insulates the top gate electrode and the source portion and the drain portion of the active pattern, and in which the data line is disposed on the third insulation layer.

Moreover, the display panel further includes a fourth insulation layer disposed on the third insulation layer on which the data line is disposed, and in which the first electrode is disposed on the fourth insulation layer, a data connecting electrode including a transparent conductive material and disposed on the fourth insulation layer, in which the data connecting electrode is electrically connected to the source portion of the active pattern and electrically connected to the data line, and a connecting electrode including a transparent conductive material and disposed on the fourth insulation layer. The connecting electrode is electrically connected to the top gate electrode and electrically connected to the gate line.

According to exemplary embodiments of the present invention, a thin film transistor includes a top gate electrode and a channel portion of an active pattern which are self aligned by a back exposure using a bottom gate electrode as a mask. Thus, a parasitic capacitance between source and drain portions of the active pattern and the bottom and top gate electrodes may be decreased. Consequently, an effective mobility of the thin film transistor may be increased.

In addition, a method of manufacturing includes forming a top gate layer including a transparent conductive material, and then forming the top gate electrode and the channel portion of the active pattern which are self aligned by a back exposure using a bottom gate electrode as a mask having an opaque metal. Thus, a boundary of the bottom gate electrode and a boundary of the top gate electrode may be substantially coincident with each other in a cross-sectional view.

BRIEF DESCRIPTION OF THE DRAWINGS

Exemplary embodiments of the invention can be understood in more detail from the following detailed description taken in conjunction with the accompanying drawings, in which.

DETAILED DESCRIPTION OF EXEMPLARY EMBODIMENTS

Figure 1:
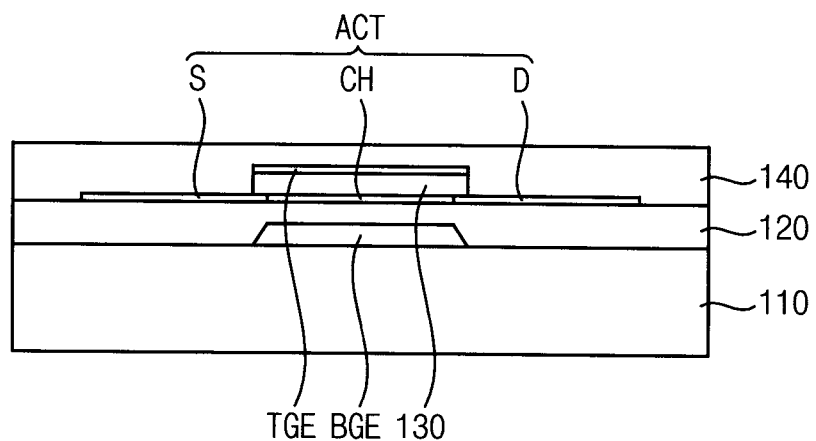
FIG. 1 is a cross-sectional view illustrating a thin film transistor according to an exemplary embodiment of the invention.

Exemplary embodiments of the present invention will be described more fully hereinafter with reference to the accompanying drawings, in which exemplary embodiments of the invention are shown.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Hereinafter, exemplary embodiments of the invention will be explained in detail with reference to the accompanying drawings.

FIG. 1 is a cross-sectional view illustrating a thin film transistor according to an exemplary embodiment of the invention Referring to FIG. 1, a thin film transistor includes, for example, a bottom gate electrode BGE, an active pattern ACT, and a top gate electrode TGE.

The thin film transistor may be disposed on a substrate 110. The thin film transistor may be explained as being disposed on the substrate 110 in the present example embodiment. The substrate 110 may include, for example, a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The bottom gate electrode BGE is disposed on the substrate 110. The bottom gate electrode BGE may include, for example, an opaque metal such as copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the bottom gate electrode BGE may have, for example, a multi layer structure having a plurality of layers including materials different from each other.

A first insulation layer 120 is disposed on the substrate 110 on which the bottom gate electrode BGE is disposed. The first insulation layer 120 covers and insulates the bottom gate electrode BGE. The first insulation layer 120 may include an inorganic or organic material. When the first insulation layer 120 includes an inorganic material, the first insulation layer 120 may include, for example, silicon oxide (SiOx) and/or silicon nitride (SiNx). In addition, the first insulation layer 120 may include, for example, a plurality of layers including materials different from each other.

The active pattern ACT is disposed on the first insulation layer 120. The active pattern ACT may have a sufficient light transmittance.

The active pattern ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may consist of an amorphous oxide including indium (In), zinc (Zn) and gallium (Ga), or an amorphous oxide including indium (In), zinc (Zn) and hafnium (Hf). The oxide semiconductor may include an oxide such as, for example, indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active pattern ACT may include indium gallium zinc oxide (IGZO), and may have a thickness of 500 Å.

In addition, although the active pattern ACT includes an oxide semiconductor in present exemplary embodiment of the present invention, it is noted that exemplary embodiments of the present invention are not limited thereto. For example, in an embodiment, the active pattern ACT may include amorphous silicon (a-Si:H) and an ohmic contact layer consisting of n+ amorphous silicon (n+ a-Si:H). In this case, the active pattern ACT may have relatively small thickness to secure a sufficient light transmittance. For example, the active pattern ACT may have thickness of about 100 Å.

The active pattern ACT includes, for example, a channel portion CH, a source portion S and a drain portion D. The channel portion CH overlaps the bottom gate electrode BGE. The source portion S is adjacent to the channel portion CH, and disposed on a same plane as the channel portion CH. The drain portion D is adjacent to the channel portion CH and disposed on the same plane as the channel portion CH. A boundary shape of the channel portion CH may be, for example, substantially coincident with a boundary shape of the bottom gate electrode BGE. Thus, a boundary line that the source or drain portion S or D and the channel portion CH contact each other may be substantially coincident with the boundary of the bottom gate electrode BGE.

A second insulation pattern 130 is disposed on the channel portion CH of the active pattern ACT. A boundary shape of the second insulation pattern 130 may be, for example, substantially coincident with the boundary shape of the channel portion CH of the active pattern ACT. The second insulation pattern 130 may include an inorganic or organic material. When the second insulation pattern 130 includes an inorganic material, the second insulation pattern 130 may include, for example, silicon oxide (SiOx) and/or silicon nitride (SiNx). In addition, the second insulation pattern 130 may include, for example, a plurality of layers including materials different from each other.

The top gate electrode TGE is disposed on the second insulation pattern 130. A boundary shape of the top gate electrode TGE is, for example, substantially coincident with the boundary shape of the second insulation pattern 130. In addition, the boundary shape of the top gate electrode TGE may be, for example, substantially coincident with the boundary shape of the bottom gate electrode BGE.

The top gate electrode TGE includes, for example, a transparent conductive oxide (TCO). For example, the top gate electrode TGE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

A third insulation layer 140 is disposed on the top gate electrode TGE and the active pattern ACT. The third insulation layer 140 covers and insulates the top gate electrode TGE and the source portion S and the drain portion D of the active pattern ACT. The third insulation layer 140 may include an inorganic or organic material. When the third insulation layer 140 includes an inorganic material, the third insulation layer 140 may include, for example, silicon oxide (SiOx) and/or silicon nitride (SiNx). In addition, the third insulation layer 140 may include, for example, a plurality of layers including materials different from each other.

The bottom gate electrode BGE, the source portion S, the active pattern ACT including the drain portion D and the channel portion CH, and the top gate electrode TGE form the thin film transistor. The thin film transistor may be operated as a double gate type transistor. Gate voltages which are the same as or different from each other may be applied to the bottom gate electrode BGE and the top gate electrode TGE.

The thin film transistor may be operated as the double gate type transistor, so that effective mobility may be increased in comparison to a traditional structure.

In addition, the boundary shape of the bottom gate electrode BGE and the boundary shape of the top gate electrode TGE may be substantially coincident with each other and may be substantially the same as each other. Thus, the top or bottom gate electrode TGE or BGE does not overlap the source portion S or the drain portion D of the active pattern ACT, so that a parasitic capacitance which is formed by overlapping a source or drain electrode and a gate electrode may be decreased.

The boundary shape of the bottom gate electrode BGE and the top gate electrode TGE may be substantially coincident with each other. A different between the boundary of the bottom gate electrode BGE and the boundary of the top gate electrode TGE in a plan view, such as a miss-align distance between the bottom gate electrode BGE and the top gate electrode TGE is defined as a skew. When a deviation of the skew is defined as a value of smallest skew subtracted from biggest skew, the deviation of the skew may be less than about 3 μm (micrometer). In an embodiment, the deviation of the skew may be, for example, less than about 0.5 μm.

FIG. 2A to 2F are cross-sectional views illustrating a method of manufacturing the thin film transistor of FIG. 1 in accordance with an exemplary embodiment of the invention.

Figure 2A:
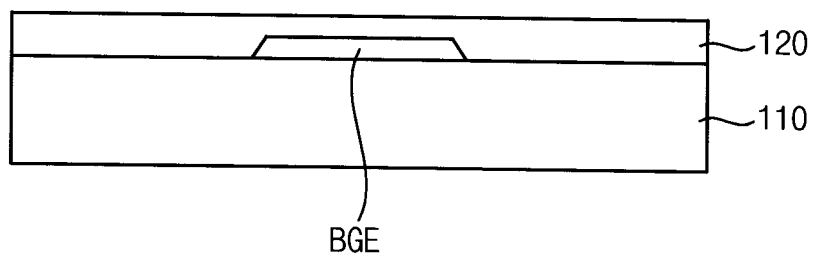
FIG. 2A to 2F are cross-sectional views illustrating a method of manufacturing the thin film transistor of FIG. 1 according to an exemplary embodiment of the invention.

Referring to FIG. 2A, a bottom gate metal layer is disposed on a substrate 110. The substrate 110 may include, for example, a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The bottom gate metal layer may be formed by, for example, a sputtering process and etc. The bottom gate metal layer may include, for example, an opaque metal such as copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the bottom gate metal layer may have, for example, a multi layer structure having a plurality of layers including materials different from each other.

A bottom gate electrode BGE is formed by patterning the bottom gate metal layer. For example, a photoresist composition is coated on the bottom gate metal layer. A photoresist pattern corresponding to the bottom gate electrode BGE is formed. Thereafter, the bottom gate metal layer, which is not covered by the photoresist pattern, is etched to form the bottom gate electrode BGE.

A first insulation layer 120 insulating the bottom gate electrode BGE is formed on the substrate 110 on which the bottom gate electrode BGE is formed. The first insulation layer 120 may include an inorganic or organic material. When the first insulation layer 120 includes an inorganic material, the first insulation layer 120 may include, for example, silicon oxide (SiOx) and/or silicon nitride (SiNx). In addition, the first insulation layer 120 may include, for example, a plurality of layers including materials different from each other.

The first insulation layer 120 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

Figure 2B:
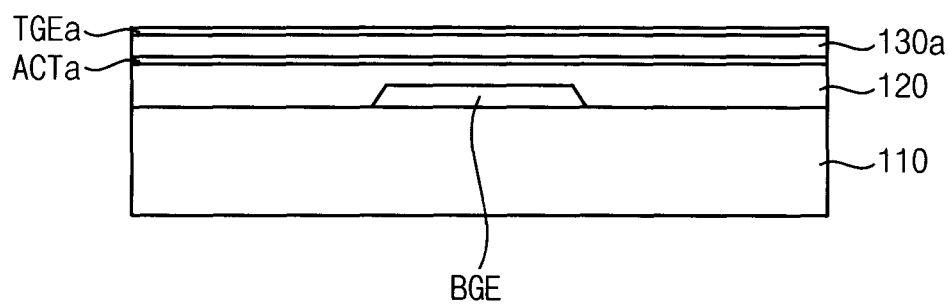

Referring to FIG. 2B, an active layer ACTa is formed on the first insulation layer 120. The active layer ACTa may have a sufficient light transmittance.

The active layer ACTa may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include an oxide such as, for example, indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACTa may include indium gallium zinc oxide (IGZO), and may have a thickness of 500 Å. The active layer ACTa may be formed by, for example, a chemical vapor deposition (CVD) process, a plasma enhanced chemical vapor deposition (PECVD) process, a solution coating process and etc.

In addition, although the active layer ACTa includes the oxide semiconductor in the present exemplary embodiment of the present invention, the active layer ACTa may alternatively include, for example, amorphous silicon (a-Si:H) and an ohmic contact layer consisting of n+ amorphous silicon (n+ a-Si:H). In this case, the active layer ACTa may have relatively small thickness to secure an sufficient light transmittance. For example, the active layer ACTa may have thickness of about 100 Å.

A second insulation layer 130a is formed on the active layer ACTa. The second insulation layer 130a may include an inorganic or organic material. When the second insulation layer 130a includes an inorganic material, the second insulation layer 130a may include, for example, silicon oxide (SiOx) and/or silicon nitride (SiNx). In addition, the second insulation layer 130a may include, for example, a plurality of layers including materials different from each other.

The second insulation layer 130a may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

A top gate layer TGEa is formed on the second insulation layer 130a. The top gate layer TGEa includes, for example, a transparent conductive oxide (TCO). For example, the top gate layer TGEa may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (In-GaMgO) or indium gallium aluminum oxide (InGaAlO). The top gate layer TGEa may be formed by, for example, a sputtering process.

Figure 2C:
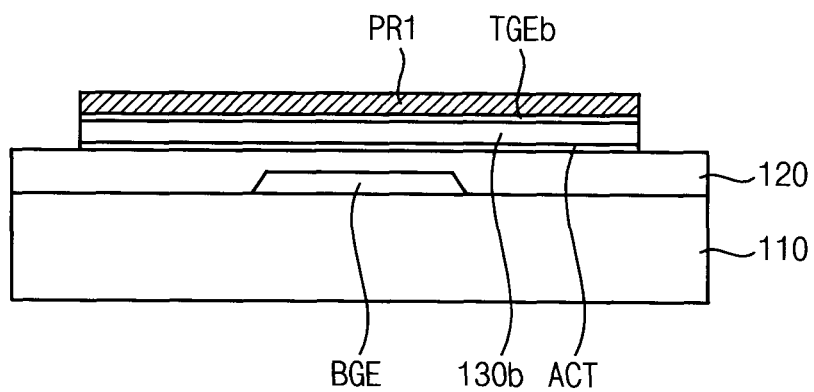

Referring to FIG. 2C, a first photoresist pattern PR1 is formed on the top gate layer TGEa. A photoresist composition is coated on the top gate layer TGEa. Thereafter, the first photoresist pattern PR1 corresponding to an active patter ACT is formed.

The top gate layer TGEa, the second insulation layer 130a and the active layer ACTa, which are not covered by the first photoresist pattern PR1, are etched to form the active pattern ACT, a preliminary second insulation pattern 130b and a preliminary top gate electrode TGEb. Thus, boundary shapes of the active pattern ACT, the preliminary second insulation pattern 130b and the preliminary top gate electrode TGEb may be, for example, substantially the same as each other. Thus, the active pattern ACT, the preliminary second insulation pattern 130b and the preliminary top gate electrode TGEb may have, for example, substantially same shapes as each other in a plan view.

After forming the active pattern ACT, the preliminary second insulation pattern 130b and the preliminary top gate electrode TGEb, the first photoresist pattern PR1 is removed.

Figure 2D:
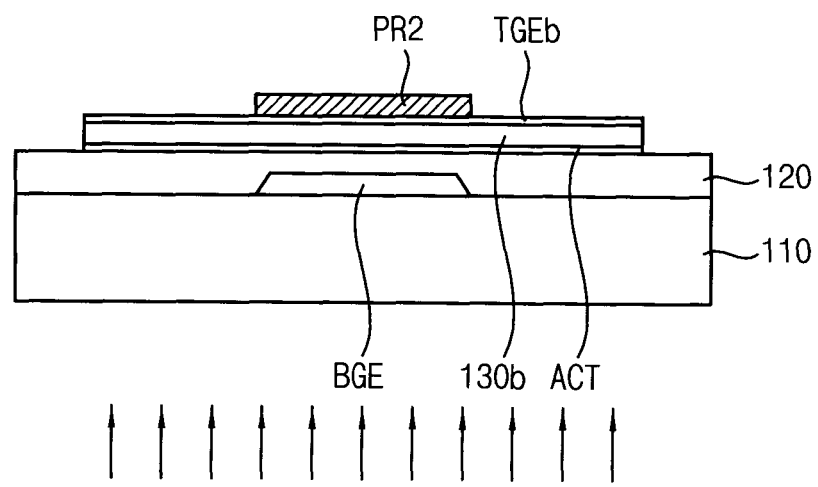

Referring to FIG. 2D, a second photoresist pattern PR2 is formed on the previous top gate electrode TGEb. A photoresist composition is coated on the preliminary top gate electrode TGEb. After a back exposure in which light is irradiated in a direction from the substrate 110 to photoresist composition (refers to an arrow in figures), the photoresist composition is developed, so that a second photoresist pattern PR2 overlapping the bottom gate electrode BGE and having a boundary shape the same as the bottom gate electrode BGE may be formed. Thus, the bottom gate electrode BGE and the second photoresist pattern PR2 may have the same shapes as each other in a plan view.

For example, the photoresist composition may be a positive photoresist composition. The active pattern ACT, the preliminary second insulation pattern 130b and the preliminary top gate electrode TGEb are transparent and have sufficient light transmittance, so that the light may be irradiated by the back exposure except for an area corresponding to the bottom gate electrode BGE. Thereafter, a portion in which the light is irradiated to is removed by a developer, so that the second photoresist pattern PR2 may be formed.

Thus, a boundary shape of the second photoresist pattern PR2 may be, for example, substantially the same as a boundary shape of the bottom gate electrode BGE. Thus, the bottom gate electrode BGE and the second photoresist pattern PR2 may have the same shapes as each other in a plan view.

Figure 2E:
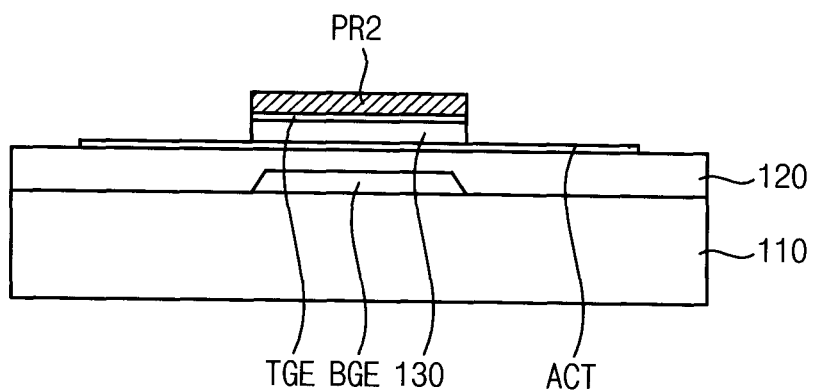

Referring to FIG. 2E, the preliminary top gate electrode TGEb and the preliminary second insulation pattern 130b which are not covered by the second photoresist pattern PR2, are etched to form a top gate electrode TGE and a second insulation pattern 130. Thus, a boundary of the top gate electrode TGE and a boundary of the second insulation pattern 130 may be, for example, substantially coincident with each other. Thus, the top gate electrode TGE and the second insulation pattern 130 have the same shapes as each other in a plan view. In addition, the second photoresist pattern PR2 is formed using the bottom gate electrode BGE as a mask, so that the boundary of the top gate electrode TGE and the boundary of the bottom gate electrode BGE may be, for example, substantially coincident with each other. The top gate electrode TGE and the bottom gate electrode BGE may be self aligned. Thus, the top gate electrode TGE and the bottom gate electrode BGE may have the same shape in a plan view.

Portions of the active pattern ACT are exposed by forming the top gate electrode TGE and the second insulation pattern 130. The portions of the active pattern ACT which are exposed become a source portion and a drain portion (refers to S and D of FIG. 2F).

Figure 2F:
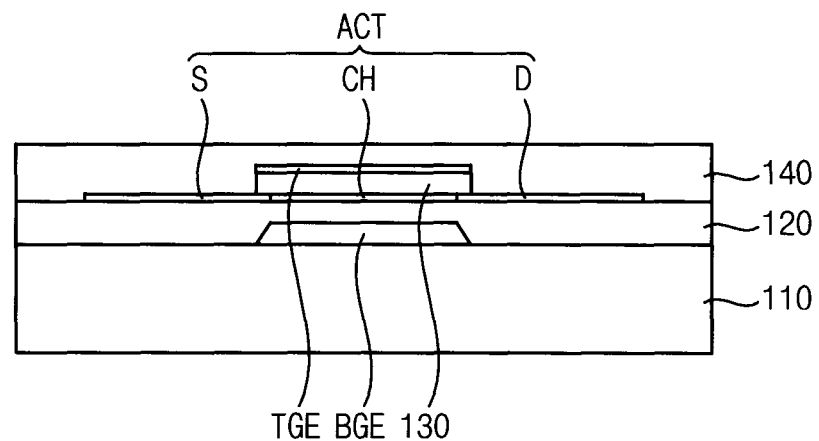

Referring to FIG. 2F, the portions of the active pattern ACT which are exposed become a source portion S and a drain portion D. The rest of the active pattern ACT which is covered by the second insulation pattern 130 becomes a channel portion CH. Thus, the portions of the active pattern ACT which are exposed form the source portion S and the drain portion D which have relatively high carrier concentration by reduction. The rest of the active pattern ACT, which becomes the channel portion CH between the source portion S and the drain portion D, is covered by the second insulation pattern 130, so that channel portion CH is not deoxidized.

For example, the source portion S and the drain portion D may be formed by using at least one or more of the following gases of fluorine ($F_2$), nitrogen trifluoride ($NF_3$), tetrafluoromethane ($CF_4$), sulfur hexafluoride ($SF_6$), and octafluorocyclobutane ($C_4F_8$) which cause the reduction of the active pattern ACT including the oxide semiconductor.

Accordingly, the thin film transistor including the bottom gate electrode BGE, the active pattern ACT including the source, channel and drain portions S, CH and D and the top gate electrode TGE may be formed.

A third insulation layer 140 may be formed on the thin film transistor. The third insulation layer 140 may include an inorganic or organic material. When the third insulation layer 140 includes an inorganic material, the third insulation layer 140 may include, for example, silicon oxide ($SiO_x$) and/or silicon nitride ($SiN_x$). In addition, the third insulation layer 140 may include, for example, a plurality of layers including materials different from each other.

The third insulation layer 140 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

Thereafter, contact holes may be formed through the third insulation layer 140 to expose the source portion S, the drain portion D and the top gate electrode TGE. Electrical connections to the thin film transistor may be formed through the contact holes.

FIG. 3A to 3F are cross-sectional views illustrating a method of manufacturing the thin film transistor of FIG. 1 according to an exemplary embodiment of the present invention.

Figure 3A:
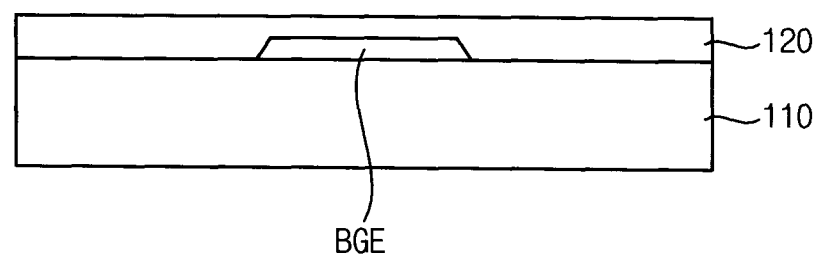
FIG. 3A to 3F are cross-sectional views illustrating a method of manufacturing the thin film transistor of FIG. 1 according to an exemplary embodiment of the invention.
Figure 3B:
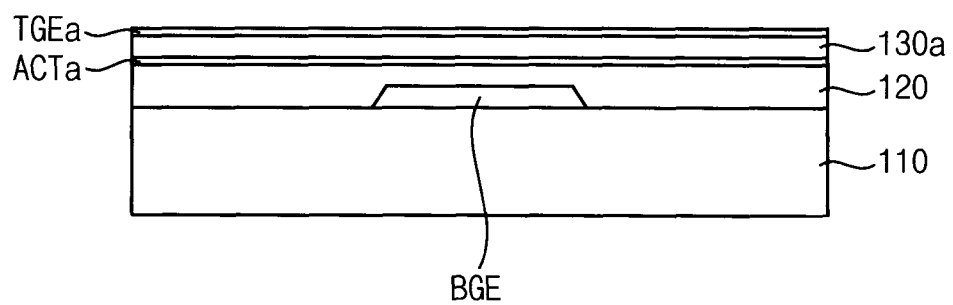

Referring to FIG. 3A, a bottom gate metal layer is formed on a substrate 110. The substrate 110 may include, for example, a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof. The bottom gate metal layer may be formed by a sputtering process and etc. The bottom gate metal layer may include, for example, an opaque metal such as copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the bottom gate metal layer may have, for example, a multi layer structure having a plurality of layers including materials different from each other.

A bottom gate electrode BGE is formed by patterning the bottom gate metal layer. For example, a photoresist composition is coated on the bottom gate metal layer. A photoresist pattern corresponding to the bottom gate electrode BGE is formed. Thereafter, the bottom gate metal layer, which is not covered by the photoresist pattern, is etched to form the bottom gate electrode BGE.

A first insulation layer 120 insulating the bottom gate electrode BGE is formed on the substrate 110 on which the bottom gate electrode BGE is formed. The first insulation layer 120 may include an inorganic or organic material. When the first insulation layer 120 includes an inorganic material, the first insulation layer 120 may include, for example, silicon oxide ($SiO_x$) and/or silicon nitride ($SiN_x$). In addition, the first insulation layer 120 may include, for example, a plurality of layers including materials different from each other.

The first insulation layer 120 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

Referring to 3B, an active layer ACTa is formed on the first insulation layer 120. The active layer ACTa may have a sufficient light transmittance.

The active layer ACTa may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACTa may include indium gallium zinc oxide (IGZO), and may have a thickness of 500 Å. The active layer ACTa may be formed by, for example, a chemical vapor deposition (CVD) process, a plasma enhanced chemical vapor deposition (PECVD) process, a solution coating process and etc.

In addition, although the active layer ACTa includes an oxide semiconductor in the present exemplary embodiment of the present invention, it is noted that exemplary embodiments of the present invention are not limited thereto. For example, in an embodiment, the active layer ACTa may include amorphous silicon (a-Si:H) and an ohmic contact layer consisting of n+ amorphous silicon (n+ a-Si:H). In this case, the active layer ACTa may have relatively small thickness to secure an sufficient light transmittance. For example, the active layer ACTa may have thickness of about 100 Å.

A second insulation layer 130a is formed on the active layer ACTa. The second insulation layer 130a may include an inorganic or organic material. When the second insulation layer 130a includes an inorganic material, the second insulation layer 130a may include, for example, silicon oxide ($SiO_x$) and/or silicon nitride ($SiN_x$). In addition, the second insulation layer 130a may include, for example, a plurality of layers including materials different from each other.

The second insulation layer 130a may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

A top gate layer TGEa is formed on the second insulation layer 130a. The top gate layer TGEa includes, for example, a transparent conductive oxide (TCO). For example, the top gate layer TGEa may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). The top gate layer TGEa may be formed by, for example, a sputtering process.

Figure 3C:
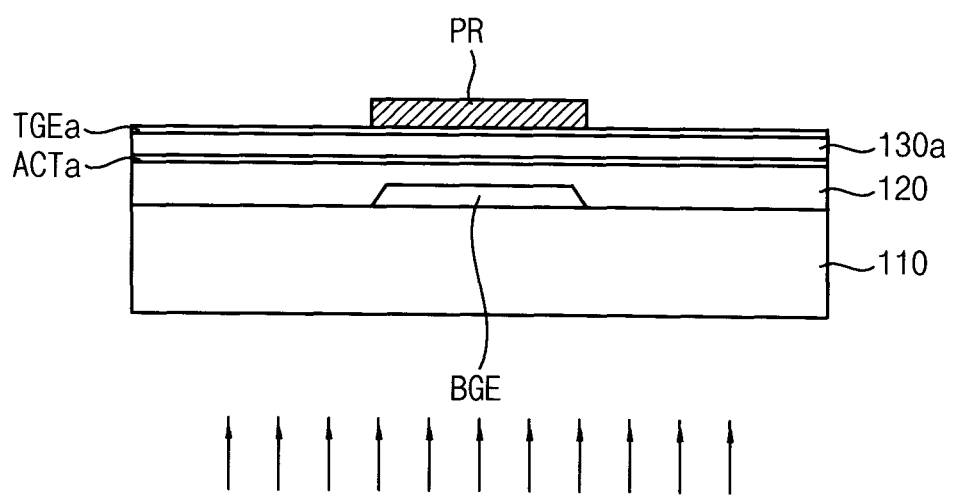

Referring to FIG. 3C, a photoresist pattern PR is formed on the top gate layer TGEa. A photoresist composition is coated on the top gate layer TGEa. After a back exposure in which light is irradiated in a direction from the substrate 110 to photoresist composition (refers to an arrow in figures), the photoresist composition is developed, so that the photoresist pattern PR overlapping the bottom gate electrode BGE and having a boundary shape the same as a boundary shape of the bottom gate electrode BGE may be formed. Thus, the bottom gate electrode BGE and the photoresist pattern PR may have the same shapes as each other in a plan view.

For example, the photoresist composition may be a positive photoresist composition. The active layer ACTa, the second insulation layer 130a and the top gate layer TGEa are transparent and have sufficient light transmittance, so that the light may be irradiated by the back exposure except for an area corresponding to the bottom gate electrode BGE. Thereafter, a portion in which the light is irradiated to is removed by a developer, so that the photoresist pattern PR may be formed.

Thus, a boundary shape of the photoresist pattern PR may be, for example, substantially the same as a boundary shape of the bottom gate electrode BGE. Thus, the bottom gate electrode BGE and the photoresist pattern PR may have the same shapes as each other in a plan view.

Figure 3D:
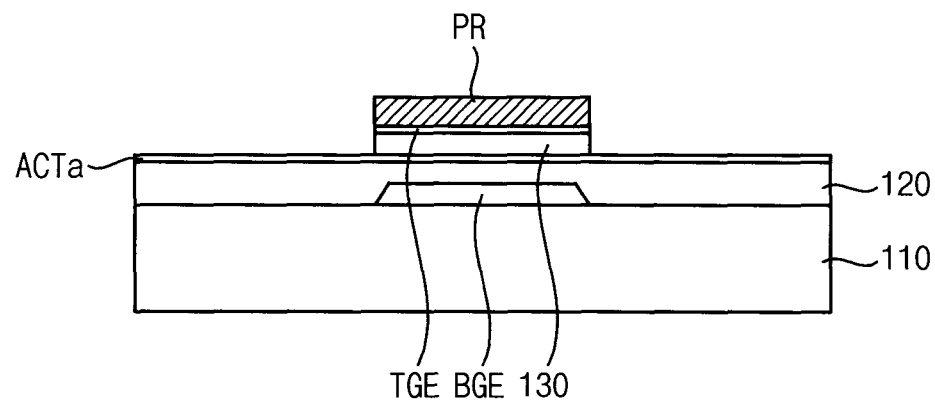

Referring to FIG. 3D, the top gate layer TGEa, the second insulation layer 130a which are not covered by the photoresist pattern PR, are etched to form a top gate electrode TGE and a second insulation pattern 130. Thus, a boundary of the top gate electrode TGE and a boundary of the second insulation pattern 130 may be, for example, substantially coincident with each other. Thus, the top gate electrode TGE and the second insulation pattern 130 have same shapes as each other in a plan view. In addition, the photoresist pattern PR is formed using the bottom gate electrode BGE as a mask, so that the boundary of the top gate electrode TGE and the boundary of the bottom gate electrode BGE may be, for example, substantially coincident with each other. The top gate electrode TGE and the bottom gate electrode BGE may be self aligned. Thus, the top gate electrode TGE and the bottom gate electrode BGE may have same shape as each other in a plan view.

Portions of the active layer ACTa are exposed by forming the top gate electrode TGE and the second insulation pattern 130. Thereafter, the photoresist pattern PR is removed.

Figure 3E:
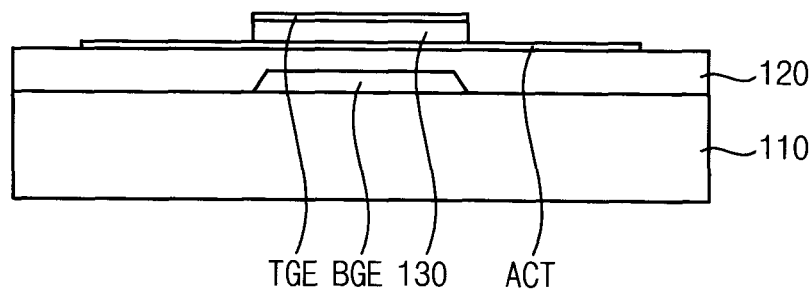

Referring to FIG. 3E, a active pattern ACT is formed by patterning the active layer ACTa. A portion of the active pattern ACT which is covered by the second insulation pattern 130 becomes a channel later (refers to CH of FIG. 3F). The portions of the active pattern ACT which are exposed become source and drain portions (S and D of FIG. 3F).

Figure 3F:
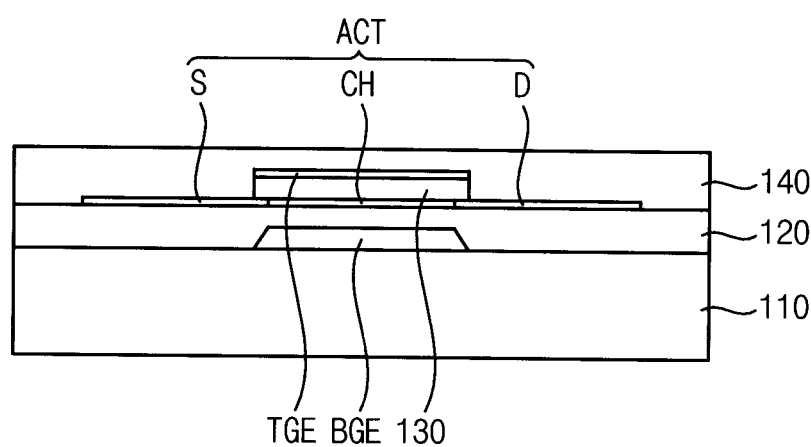

Referring to FIG. 3F, the portions of the active pattern ACT which are exposed become a source portion S and a drain portion D spaced apart from the source portion S. The portion of the active pattern ACT which is covered by the second insulation pattern 130 becomes a channel portion CH. Thus, the portions of the active pattern ACT which are exposed form the source portion S and the drain portion D which have relatively high carrier concentration by reduction. The portion of the active pattern ACT, which becomes the channel portion CH between the source portion S and the drain portion D, is covered by the second insulation pattern 130, so that channel portion CH is not deoxidized.

For example, the source portion S and the drain portion D may be formed by using at least one or more of the following gases of fluorine (F2), nitrogen trifluoride (NF3), tetrafluoromethane (CF4), sulfur hexafluoride (SF6), and octafluorocyclobutane (C4F8) which cause the reduction of the active pattern ACT including the oxide semiconductor.

Accordingly, the thin film transistor including the bottom gate electrode BGE, the active pattern ACT including the source, channel and drain portions S, CH and D and the top gate electrode TGE may be formed.

A third insulation layer 140 may be formed on the thin film transistor. The third insulation layer 140 may include an inorganic or organic material. When the third insulation layer 140 includes an inorganic material, the third insulation layer 140 may include, for example, silicon oxide (SiOx) and/or silicon nitride (SiNx). In addition, the third insulation layer 140 may include, for example, a plurality of layers including materials different from each other.

The third insulation layer 140 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

Thereafter, contact holes may be formed through the third insulation layer 140 to expose the source portion S, the drain portion D and the top gate electrode TGE. Electrical connections to the thin film transistor may be formed through the contact holes.

Figure 4:
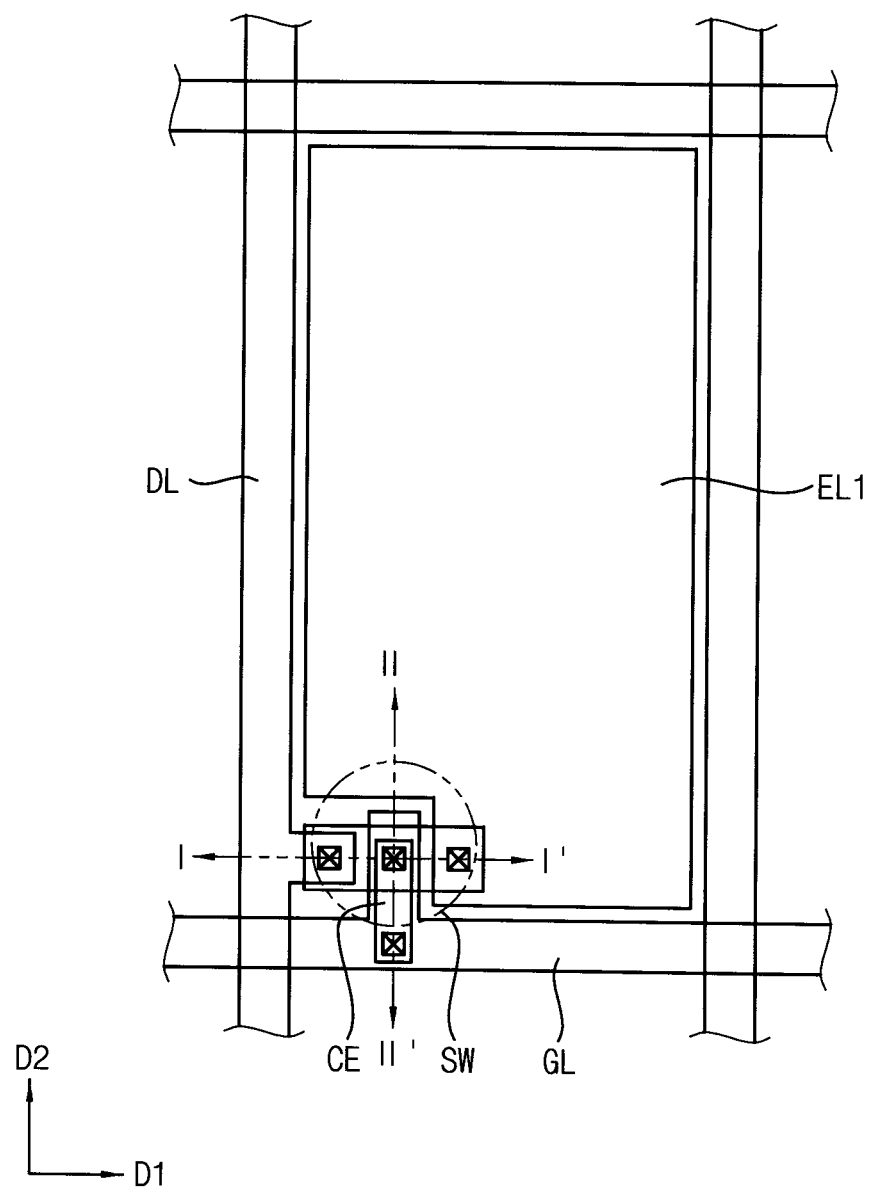
FIG. 4 is a plan view of an array substrate of a display panel according to an exemplary embodiment of the invention.

FIG. 4 is a plan view of an array substrate of a display panel according to an exemplary embodiment of the invention.

Referring to FIG. 4, the display panel includes, for example, a gate line GL, a data line DL, a thin film transistor SW and a first electrode EL1.

The gate line GL extends along a first direction D1. The data line DL extends along a second direction D2 substantially perpendicular to the first direction D1, and crosses the gate line GL but exemplary embodiments of the present invention are not limited thereto. For example, alternatively in an embodiment, the data line DL may extend along the first direction D1 and the gate line GL may extend along the second direction D2 substantially perpendicular to the first direction D1, and may cross the data line DL.

The gate line GL and the data line DL defines a pixel area. Although only one pixel area is generally described in the figures, the display substrate according to the exemplary embodiments generally includes a large number of pixel units respectively formed in respective pixel areas. The pixel areas are typically arrayed for example as a regular matrix structure having a plurality of rows and columns. The pixel areas typically have the same basic and repeated structures (although some variation for example in color of color filter portion or size or shape of pixel-electrode may occur), so that only one pixel area will be described herein as an example. Although the pixel area has a rectangular shape in the figures, the pixel area may have various modifications in size and/or shape and/or number of field altering slits or other fine features included therein. For example the pixel areas may have V or Z shapes.

Figure 5A:
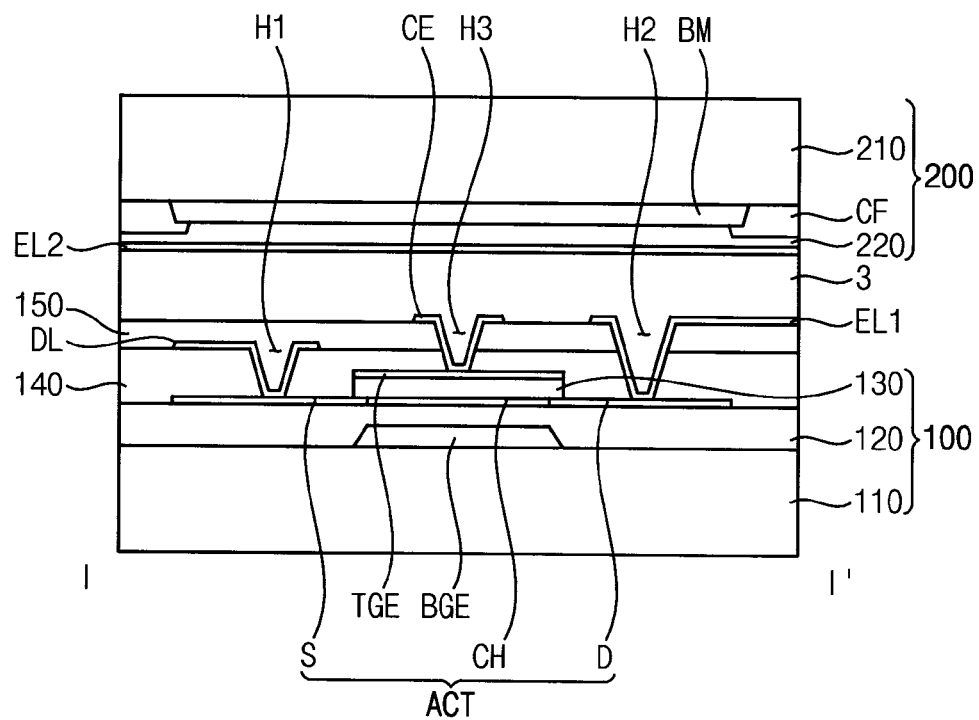
FIG. 5A is a cross-sectional view of a display panel including the array substrate taken along line I-I' of FIG. 4.
Figure 5B:
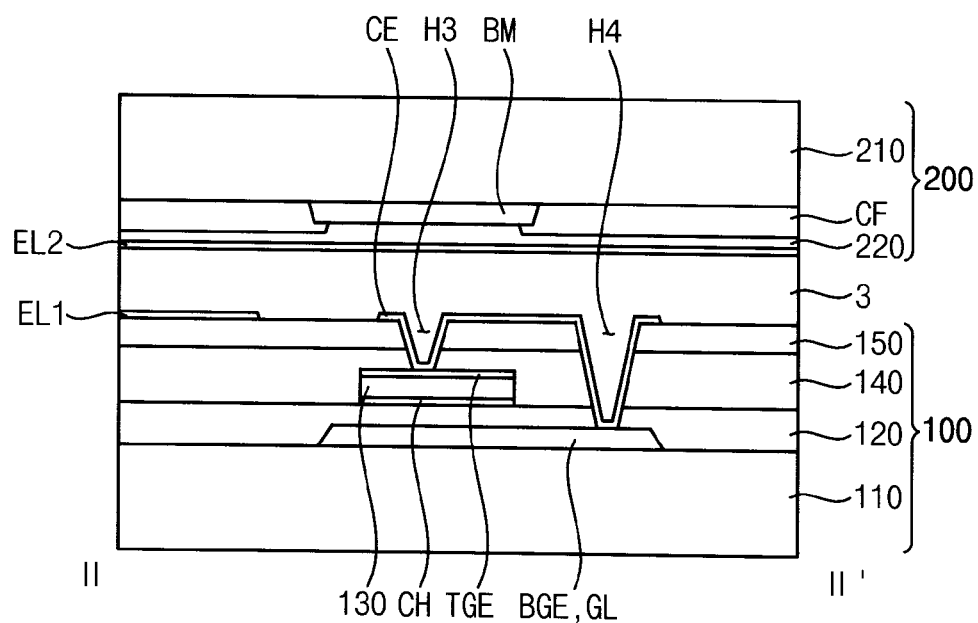
FIG. 5B is a cross-sectional view of a display panel including the array substrate taken along line II-II' of FIG. 4.

The thin film transistor SW includes, for example, a bottom gate electrode, an active pattern including source, channel and drain portions, and a top gate electrode (refers to FIGS. 5A and 5B). The thin film transistor SW is electrically connected to the gate line GL through a connecting electrode CE, and electrically connected to the data line DL and the first electrode EL1.

The first electrode EL1 is formed in the pixel area. The first electrode EL1 may include, for example, a transparent conductive material. For example, the first electrode EL1 may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the first electrode EL1 may further include, for example, titanium (Ti) and/or molybdenum titanium (MoTi).

FIG. 5A is a cross-sectional view of a display panel including the array substrate taken along line I-I' of FIG. 4. FIG. 5B is a cross-sectional view of a display panel including the array substrate taken along line II-IP of FIG. 4.

Referring to FIGS. 5A and 5B, the display panel includes, for example, an array substrate 100, an opposite substrate 200 facing the array substrate 100 and a liquid crystal layer 3 disposed between the array substrate 100 and the opposite substrate 200.

The array substrate 100 includes, for example, a first substrate 110, a bottom gate electrode BGE, a gate line GL, a first insulation layer 120, an active pattern ACT, a second insulation pattern 130, a top gate electrode TGE, a third insulation layer 140, a data line DL, a fourth insulation layer 150, a connecting electrode CE and a first electrode EL1.

The first substrate 110 is a transparent insulation substrate. For example, the first substrate 110 may include a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The bottom gate electrode BGE and the gate line GL electrically connected to the bottom gate electrode BGE are disposed on the first substrate 110. The bottom gate electrode BGE may include, for example, an opaque metal such as copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the bottom gate electrode BGE may have, for example, a multi layer structure having a plurality of layers including materials different from each other.

The first insulation layer 120 is disposed on the substrate 110 on which the bottom gate electrode BGE and the gate line GL is disposed. The first insulation layer 120 covers and insulates the bottom gate electrode BGE. The first insulation layer 120 may include an inorganic or organic material. When the first insulation layer 120 includes an inorganic material, the first insulation layer 120 may include, for example, silicon oxide (SiOx) and/or silicon nitride (SiNx). In addition, the first insulation layer 120 may include, for example, a plurality of layers including materials different from each other.

The active pattern ACT is disposed on the first insulation layer 120. The active pattern ACT may have a sufficient light transmittance.

The active pattern ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active pattern ACT may include indium gallium zinc oxide (IGZO), and may have a thickness of 500 Å.

In addition, although the active pattern ACT includes an oxide semiconductor in the present exemplary embodiment of the present invention, it is noted that exemplary embodiments of the present invention are not limited thereto. For example, in an exemplary embodiment, the active pattern ACT may include amorphous silicon (a-Si:H) and an ohmic contact layer consisting of n+ amorphous silicon (n+ a-Si:H). In this case, the active pattern ACT may have relatively small thickness to secure a sufficient light transmittance. For example, the active pattern ACT may have thickness of about 100 Å.

The active pattern ACT includes, for example, a channel portion CH, a source portion S and a drain portion D. The channel portion CH overlaps the bottom gate electrode BGE. The source portion S is adjacent to the channel portion CH, and disposed on a same plane as the channel portion CH. The drain portion D is adjacent to the channel portion CH and disposed on the same plane as the channel portion CH. A boundary shape of the channel portion CH may be, for example, substantially coincident with a boundary shape of the bottom gate electrode BGE. Thus, a boundary line in which the source or drain portion S or D and the channel portion CH contact each other may be substantially coincident with the boundary of the bottom gate electrode BGE.

The second insulation pattern 130 is disposed on the channel portion CH of the active pattern ACT. A boundary shape of the second insulation pattern 130 may be, for example, substantially coincident with the boundary shape of the channel portion CH of the active pattern ACT. The second insulation pattern 130 may include an inorganic or organic material. When the second insulation pattern 130 includes an inorganic material, the second insulation pattern 130 may include, for example, silicon oxide (SiOx) and/or silicon nitride (SiNx). In addition, the second insulation pattern 130 may include, for example, a plurality of layers including materials different from each other.

The top gate electrode TGE is disposed on the second insulation pattern 130. A boundary shape of the top gate electrode TGE is, for example, substantially coincident with the boundary shape of the second insulation pattern 130. Thus, the top gate electrode TGE and the second insulation pattern 130 have the same shapes as each other in a plan view. In addition, the boundary shape of the top gate electrode TGE may be, for example, substantially coincident with the boundary shape of the bottom gate electrode BGE. Thus, the top gate electrode TGE and the bottom gate electrode BGE have the same shapes as each other in a plan view. The top gate electrode TGE includes, for example, a transparent conductive oxide (TCO). For example, the top gate electrode TGE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

The bottom gate electrode BGE, the source portion S, the active pattern ACT including the drain portion D and the channel portion CH, and the top gate electrode TGE form the thin film transistor. (refers to SW of FIG. 4) The thin film transistor may be operated as a double gate type transistor, so that effective mobility may be increased in comparison to a traditional structure.

In addition, the boundary shape of the bottom gate electrode BGE and the boundary shape of the top gate electrode TGE may be, for example, substantially coincident with each other and may be substantially the same as each other. Thus, the top or bottom gate electrode TGE or BGE does not overlap the source portion S or the drain portion D of the active pattern ACT, so that a parasitic capacitance which is formed by overlapping source or drain electrode and a gate electrode may be decreased.

The boundary shape of the bottom gate electrode BGE and the top gate electrode TGE may be, for example, substantially coincident with each other. A difference between the boundary of the bottom gate electrode BGE and the boundary of the top gate electrode TGE in a plan view, such as a miss-align distance between the bottom gate electrode BGE and the top gate electrode TGE is defined as a skew. When a deviation of the skew is defined as a value of smallest skew subtracted from the biggest skew, the deviation of the skew may be less than about 3 μm (micrometer). In an embodiment, the deviation of the skew may be, for example, less than about 0.5 μm.

The third insulation layer 140 is disposed on the top gate electrode TGE and the active pattern ACT. The third insulation layer 140 covers and insulates the top gate electrode TGE and the source portion S and the drain portion D of the active pattern ACT. The third insulation layer 140 may include an inorganic or organic material. When the third insulation layer 140 includes an inorganic material, the third insulation layer 140 may include, for example, silicon oxide (SiOx) and/or silicon nitride (SiNx). In addition, the third insulation layer 140 may include, for example, a plurality of layers including materials different from each other.

A first contact hole H1 is formed through the third insulation layer 140. The first contact hole H1 exposes the source portion S of the active pattern ACT.

The data line DL is disposed on the third insulation layer 140. The data line DL is electrically connected to the source portion S of the active pattern ACT through the first contact hole H1. The data line DL may have, for example, a single layer structure including copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the data line DL may have, for example, a multi layer structure having a plurality of layers including materials different from each other.

The fourth insulation layer 150 is disposed on the third insulation layer 140 on which the data line DL is disposed. The fourth insulation layer 150 may include an inorganic or organic material. When the fourth insulation layer 150 includes an inorganic material, the fourth insulation layer 150 may include, for example, silicon oxide (SiOx) and/or silicon nitride (SiNx). In addition, the fourth insulation layer 150 may include, for example, a plurality of layers including materials different from each other.

A second contact hole H2 is formed through the fourth insulation layer 150 and the third insulation layer 140. The second contact hole H2 exposes the drain portion D of the active pattern ACT.

A third contact hole H3 is formed through the fourth insulation layer 150 and the third insulation layer 140. The third contact hole H3 exposes the top gate electrode TGE.

A fourth contact hole H4 is formed through the fourth insulation layer 150, the third insulation layer 140 and the first insulation layer 120. The fourth contact hole H4 exposes a portion of the gate line GL.

The connecting electrode CE is disposed on the fourth insulation layer 150. The connecting electrode CE is electrically connected to the top gate electrode TGE through the third contact hole H3. In addition, the connecting electrode CE is electrically connected to the gate line GL through the fourth contact hole H4. Thus, the connecting electrode CE may apply a gate signal applied to the connecting electrode CE to the top gate electrode TGE. The connecting electrode CE includes, for example, a transparent conductive material. For example, the connecting electrode CE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the connecting electrode CE may further include, for example, titanium (Ti) and/or molybdenum titanium (MoTi).

The first electrode EL1 is disposed on the fourth insulation layer 150. The first electrode EL1 is electrically connected to the drain portion D of the active pattern ACT through the second contact hole H2. The first electrode EL1 includes, for example, a transparent conductive material. For example, the first electrode EL1 may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the first electrode EL1 may further include, for example, titanium (Ti) and/or molybdenum titanium (MoTi).

The connecting electrode CE and the first electrode EL1 may include, for example, the same material as each other.

The opposite substrate 200 includes, for example, a second substrate 210, a black matrix BM, a color filter CF, an overcoating layer 220 and a second electrode EL2.

The second substrate 210 faces the first substrate 110. The second substrate 210 is a transparent insulation substrate. For example, the second substrate 210 may include a glass substrate, a quartz substrate, a silicon substrate, a plastic substrate or the like. For example, in an exemplary embodiment, the substrate 210 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The black matrix BM is disposed on the second substrate 210. The black matrix BM corresponds to an area except for the pixel area, and blocks light. Thus, the black matrix BM overlaps with the thin film transistor SW, the data line DL and the gate line GL. Although the black matrix BM overlaps with the thin film transistor SW, the data line DL and the gate line GL in the present exemplary embodiment, it is noted exemplary embodiments of the present invention are not limited thereto. For example, in an embodiment, the black matrix BM may be disposed in other areas where the light should be blocked.

The color filter CF is disposed on the black matrix BM and the second substrate 210. The color filter CF supplies colors to the light passing through the liquid crystal layer 3. The color filter CF may include, for example, a red color filter, a green color filter and blue color filter. The color filter CF corresponds to the pixel area. The color filters adjacent to each other may have, for example, different colors. The color filter CF may be overlapped with adjacent color filter CF in a boundary of the pixel area, or the color filter CF may be spaced apart from adjacent color filter CF in the boundary of the pixel area.

The over-coating layer 220 is disposed on the black matrix BM and the color filter CF. The over-coating layer 220 flattens the color filter CF, protects the color filter CF, and insulates the color filter CF. The over-coating layer 220 may include, for example, an acrylic-epoxy material.

The second electrode EL2 is disposed on the over-coating layer 220. The second electrode EL2 includes, for example, a transparent conductive material. For example, the second electrode EL2 may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the second electrode EL2 may further, for example, include titanium (Ti) and/or molybdenum titanium (MoTi).

The liquid crystal layer 3 is disposed between the array substrate 100 and the opposite substrate 200. The liquid crystal layer 3 includes liquid crystal molecules having optical anisotropy. The liquid crystal molecules are driven by electric field, so that an image is displayed by passing or blocking light through the liquid crystal layer 3.

FIG. 6A to 12C are cross-sectional views illustrating a method of manufacturing the array substrate of the display panel of FIG. 4 according to an exemplary embodiment of the present invention.

Figure 6A:
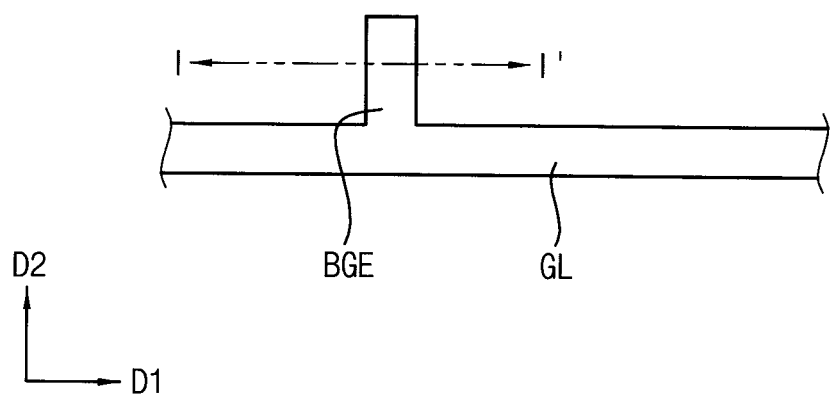
FIG. 6A to 12C are cross-sectional views illustrating a method of manufacturing the array substrate of the display panel of FIG. 4 according to an exemplary embodiment of the invention.
Figure 6B:
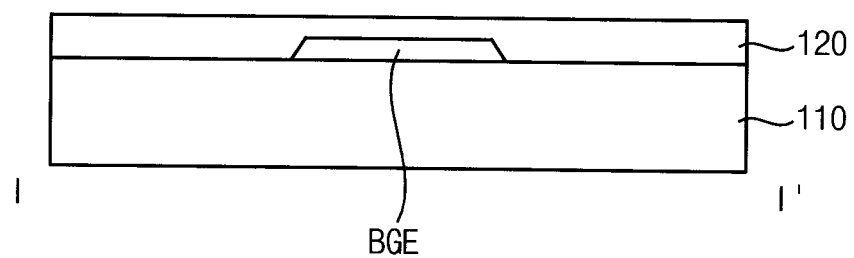

Referring to FIGS. 6A and 6B, a bottom gate metal layer is formed on a substrate 110. The substrate 110 may include, for example, a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof. The bottom gate metal layer may be formed by, for example, a sputtering process. The bottom gate metal layer may include, for example, an opaque metal such as copper (Cu), silver (Ag), chromium (Cr), molybdenum (Mo), aluminum (Al), titanium (Ti), manganese (Mn) and a mixture thereof. In addition, the bottom gate metal layer may have, for example, a multi layer structure having a plurality of layers including materials different from each other.

A bottom gate pattern is formed by patterning the bottom gate metal layer. For example, a photoresist composition is coated on the bottom gate metal layer. A photoresist pattern corresponding to the bottom gate pattern is formed. Thereafter, the bottom gate metal layer, which is not covered by the photoresist pattern, is etched to form the bottom gate pattern. The bottom gate pattern includes, for example, a bottom gate electrode BGE and a gate line GL electrically connected to the bottom gate electrode BGE. The gate line GL extends in a first direction D1.

A first insulation layer 120 is formed on the substrate 110 on which the bottom gate electrode BGE and the gate line GL are formed. The first insulation layer 120 covers and insulates the bottom gate electrode BGE and the gate line GL. The first insulation layer 120 may include an inorganic or organic material. When the first insulation layer 120 includes an inorganic material, the first insulation layer 120 may include, for example, silicon oxide (SiOx) and/or silicon nitride (SiNx). In addition, the first insulation layer 120 may include, for example, a plurality of layers including materials different from each other.

The first insulation layer 120 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

Figure 7A:
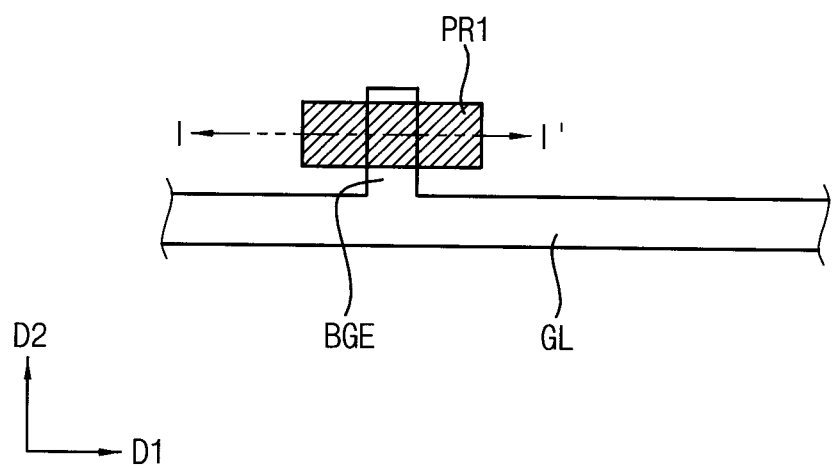
Figure 7B:
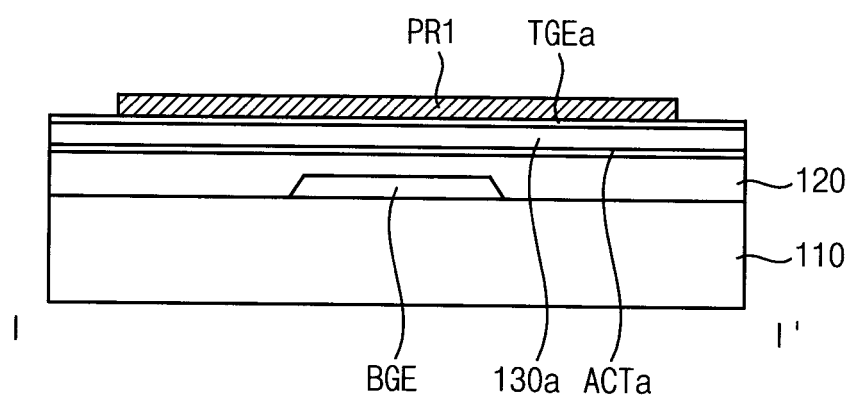

Referring to FIGS. 7A and 7B, an active layer ACTa is formed on the first insulation layer 120. The active layer ACTa may have a sufficient light transmittance.

The active layer ACTa may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACTa may include indium gallium zinc oxide (IGZO), and may have a thickness of 500 Å. The active layer ACTa may be formed by, for example, a chemical vapor deposition (CVD) process, a plasma enhanced chemical vapor deposition (PECVD) process, a solution coating process and etc.

In addition, although the active layer ACTa includes an oxide semiconductor in the present exemplary embodiment of the present invention, it is noted that exemplary embodiments of the present invention are not limited thereto. For example, in an exemplary embodiment, the active layer ACTa may include amorphous silicon (a-Si:H) and an ohmic contact layer consisting of n+ amorphous silicon (n+ a-Si:H). In this case, the active layer ACTa may have relatively small thickness to secure an sufficient light transmittance. For example, the active layer ACTa may have thickness of about 100 Å.

A second insulation layer 130a is formed on the active layer ACTa. The second insulation layer 130a may include an inorganic or organic material. When the second insulation layer 130a includes an inorganic material, the second insulation layer 130a may include, for example, silicon oxide (SiOx) and/or silicon nitride (SiNx). In addition, the second insulation layer 130a may include, for example, a plurality of layers including materials different from each other.

The second insulation layer 130a may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

A top gate layer TGEa is formed on the second insulation layer 130a. The top gate layer TGEa includes, for example, a transparent conductive oxide (TCO). For example, the top gate layer TGEa may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). The top gate layer TGEa may be formed by, for example, a sputtering process.

A first photoresist pattern PR1 is formed on the top gate layer TGEa. A photoresist composition is coated on the top gate layer TGEa. Thereafter, the first photoresist pattern PR1 corresponding to an active patter ACT is formed. The first photoresist pattern PR1 partially overlaps the bottom gate electrode BGE.

Figure 8A:
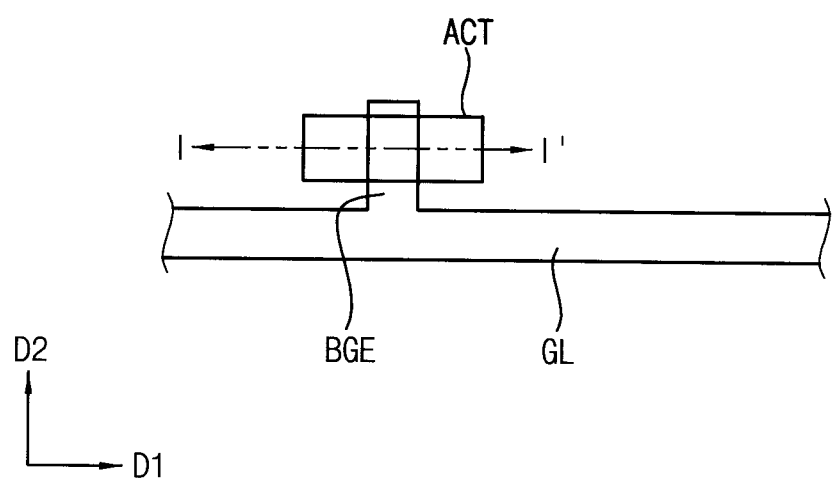
Figure 8B:
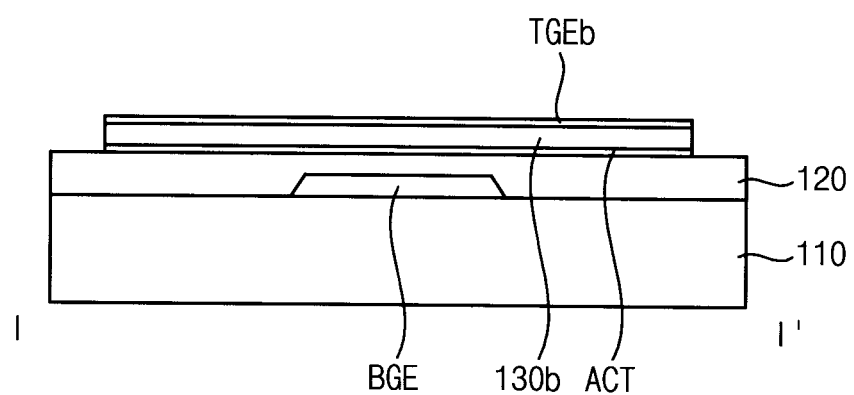

Referring to FIGS. 8A and 8B, the top gate layer TGEa, the second insulation layer 130a and the active layer ACTa, which are not covered by the first photoresist pattern PR1, are etched to form the active pattern ACT, a preliminary second insulation pattern 130b and a preliminary top gate electrode TGEb. Thus, boundary shapes of the active pattern ACT, the preliminary second insulation pattern 130b and the preliminary top gate electrode TGEb may be, for example, substantially the same as each other. Thus, the active pattern ACT, the preliminary second insulation pattern 130b and the previous top gate electrode TGEb may have substantially the same shapes as each other in a plan view.

After forming the active pattern ACT, the preliminary second insulation pattern 130b and the preliminary top gate electrode TGEb, the first photoresist pattern PR1 is removed.

Figure 9A:
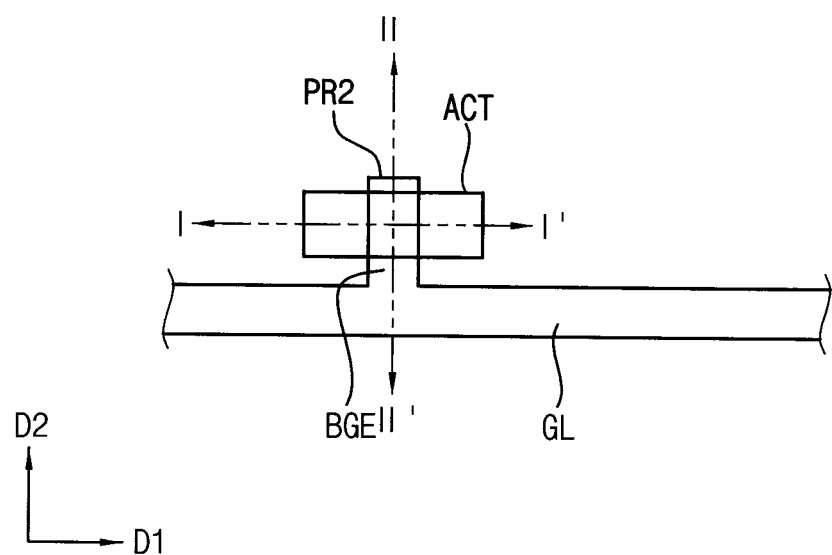
Figure 9B:
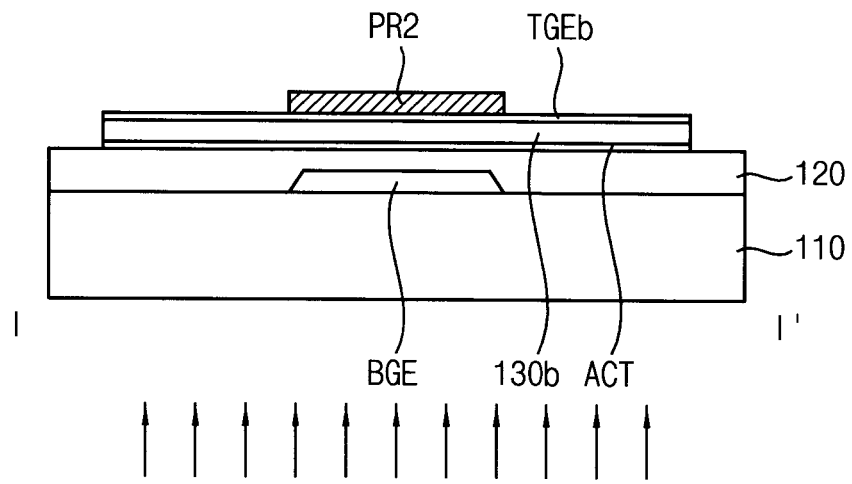
Figure 9C:
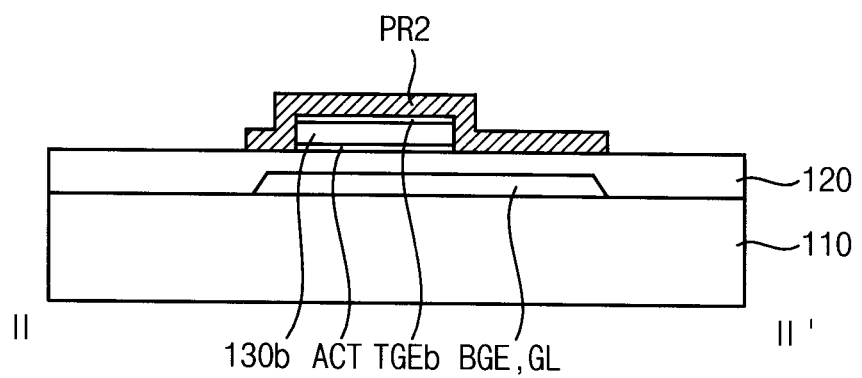

Referring to FIGS. 9A to 9C, a second photoresist pattern PR2 is formed on the preliminary top gate electrode TGEb. A photoresist composition is coated on the preliminary top gate electrode TGEb. After a back exposure in which light is irradiated in a direction from the substrate 110 to photoresist composition (refers to an arrow in figures), the photoresist composition is developed, so that a second photoresist pattern PR2 overlapping the bottom gate electrode BGE and having a boundary shape the same as the bottom gate electrode BGE may be formed. Thus, the bottom gate electrode BGE and the second photoresist pattern PR2 may have same shapes in a plan view.

For example, the photoresist composition may be a positive photoresist composition. The active pattern ACT, the preliminary second insulation pattern 130b and the previous top gate electrode TGEb are transparent and have sufficient light transmittance, so that the light may be irradiated by the back exposure except for an area corresponding to the bottom gate electrode BGE. Thereafter, a portion in which the light is irradiated to is removed by a developer, so that the second photoresist pattern PR2 may be formed.

Thus, a boundary shape of the second photoresist pattern PR2 may be, for example, substantially the same as a boundary shape of the bottom gate electrode BGE. Thus, the bottom gate electrode BGE and the second photoresist pattern PR2 may have the same shapes as each other in a plan view.

Figure 10A:
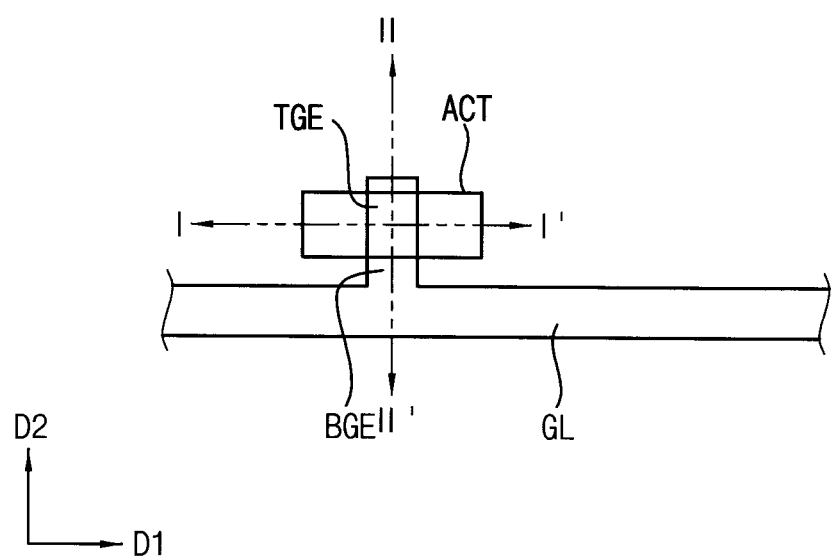
Figure 10B:
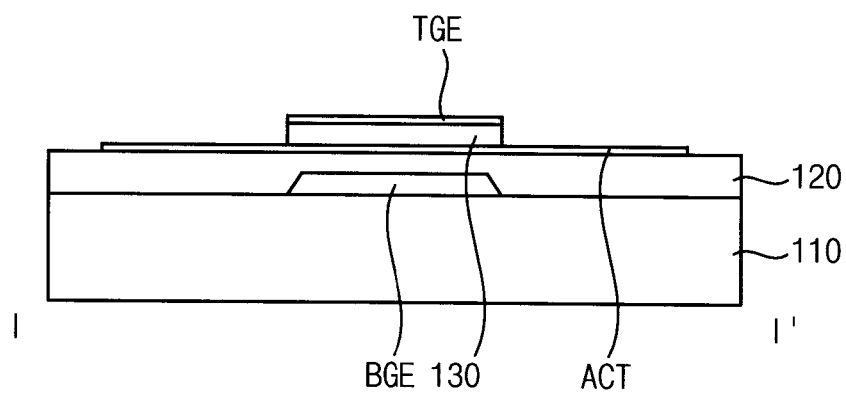
Figure 10C:
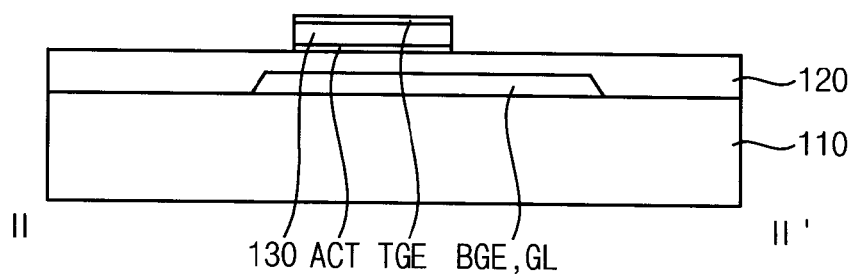

Referring to FIGS. 10A to 10C, the preliminary top gate electrode TGEb and the preliminary second insulation pattern 130b which are not covered by the second photoresist pattern PR2, are etched to form a top gate electrode TGE and a second insulation pattern 130. Thus, a boundary of the top gate electrode TGE and a boundary of the second insulation pattern 130 may be, for example, substantially coincident with each other. Thus, the top gate electrode TGE and the second insulation pattern 130 have the same shapes as each other in a plan view. In addition, the second photoresist pattern PR2 is formed using the bottom gate electrode BGE as a mask, so that the boundary of the top gate electrode TGE and the boundary of the bottom gate electrode BGE may be, for example, substantially coincident with each other. The top gate electrode TGE and the bottom gate electrode BGE may be self aligned. Thus, the top gate electrode TGE and the bottom gate electrode BGE may have same shape as each other in a plan view.

Portions of the active pattern ACT are exposed by forming the top gate electrode TGE and the second insulation pattern 130. The portions of the active pattern ACT which are exposed become a source portion and a drain portion (refers to S and D of FIG. 11B).

Figure 11A:
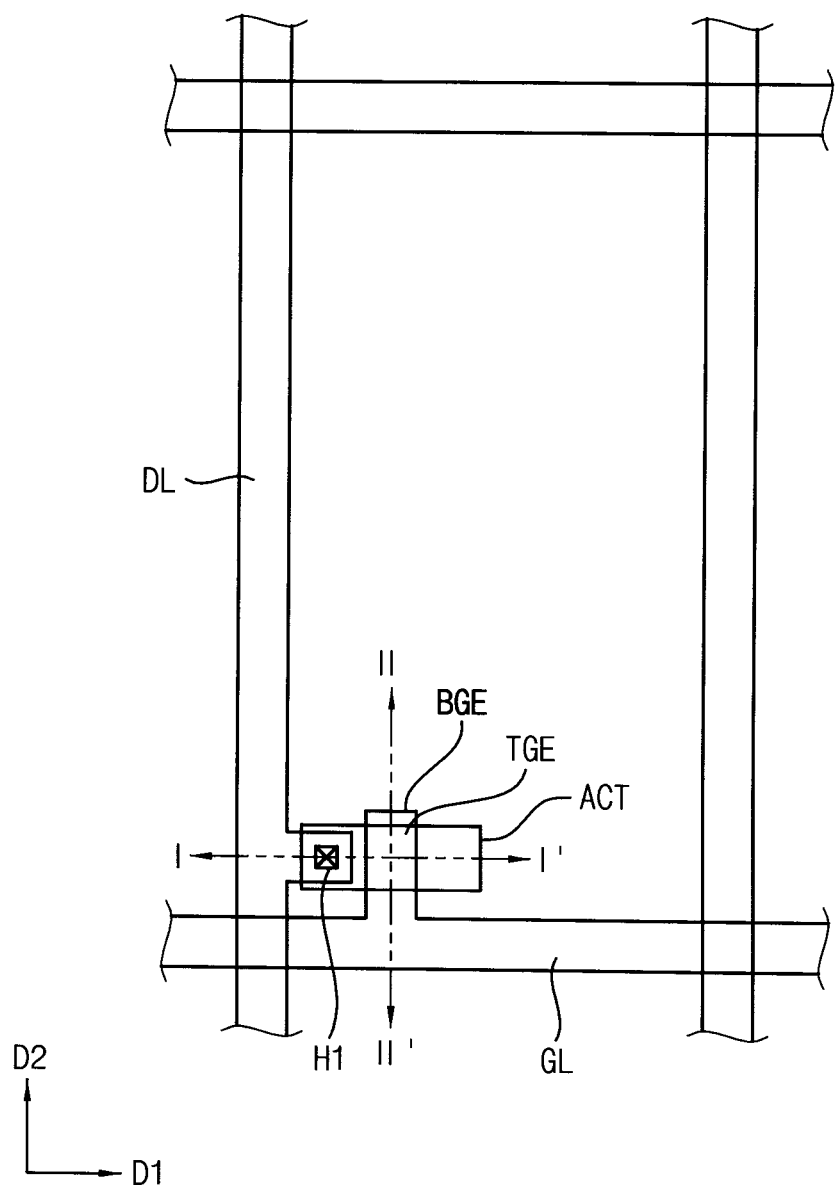
Figure 11B:
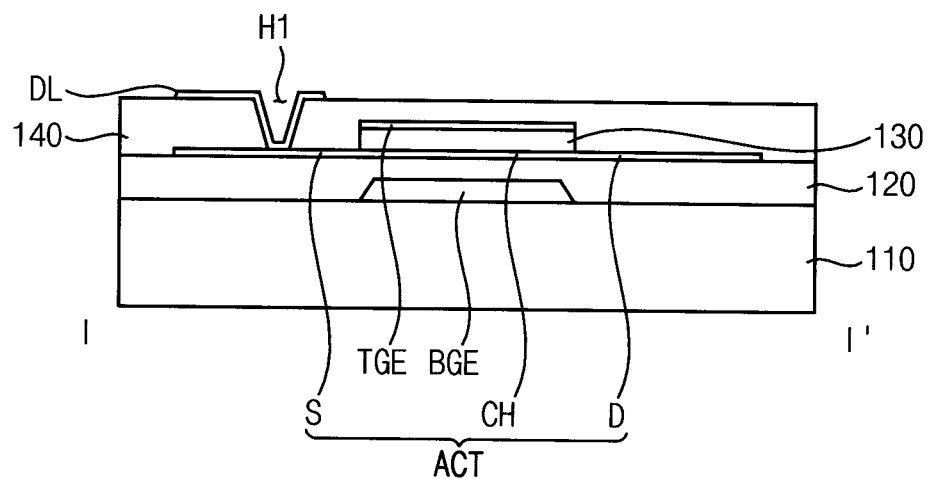
Figure 11C:
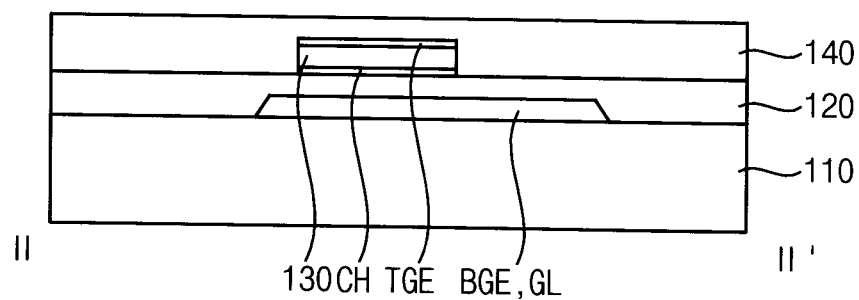

Referring to FIGS. 11A to 11C, the portions of the active pattern ACT which are exposed become a source portion S and a drain portion D spaced apart from the source portion S. The rest of the active pattern ACT which is covered by the second insulation pattern 130 becomes a channel portion CH. Thus, the portions of the active pattern ACT which are exposed form the source portion S and the drain portion D which have relatively high carrier concentration by reduction. The rest of the active pattern ACT, which becomes the channel portion CH between the source portion S and the drain portion D, is covered by the second insulation pattern 130, so that channel portion CH is not deoxidized.

For example, the source portion S and the drain portion D may be formed by using at least one or more of the following gases of fluorine (F2), nitrogen trifluoride (NF3), tetrafluoromethane (CF4), sulfur hexafluoride (SF6), and octafluorocyclobutane (C4F8) which cause the reduction of the active pattern ACT including the oxide semiconductor.

Accordingly, the thin film transistor including the bottom gate electrode BGE, the active pattern ACT including the source, channel and drain portions S, CH and D and the top gate electrode TGE may be formed.

A third insulation layer 140 may be formed on the thin film transistor. The third insulation layer 140 may include an inorganic or organic material. When the third insulation layer 140 includes an inorganic material, the third insulation layer 140 may include, for example, silicon oxide (SiOx) and/or silicon nitride (SiNx). In addition, the third insulation layer 140 may include, for example, a plurality of layers including materials different from each other.

The third insulation layer 140 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

A first contact hole H1 is formed through the third insulation layer 140. The first contact hole H1 exposes the source portion S of the active pattern ACT.

A data metal layer is formed on the third insulation layer 140. The data metal layer may be formed by, for example, a sputtering process. The data metal layer may have, for example, a single layer structure including copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the data metal layer may have, for example, a multi layer structure having a plurality of layers including materials different from each other.

A data line DL is formed by patterning the data metal layer. For example, a photoresist composition is coated on the bottom data metal layer. A photoresist pattern corresponds to the data line DL. Thereafter, the data metal layer, which is not covered by the photoresist pattern, is etched to form the data line DL.

The data line DL extends along a second direction D2 substantially perpendicular to the first direction D1, and crosses the gate line GL. As discussed, alternatively, in an embodiment, the data line DL may instead, for example, extend along the first direction D1 and the gate line GL may extend along the second direction D2 substantially perpendicular to the first direction D1, and cross the data line DL. The data line DL is electrically connected to the source portion S of the active pattern ACT through the first contact hole H1. The data line DL may include, for example, copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the data line DL may have, for example, a multi layer structure having a plurality of layers including materials different from each other.

Figure 12A:
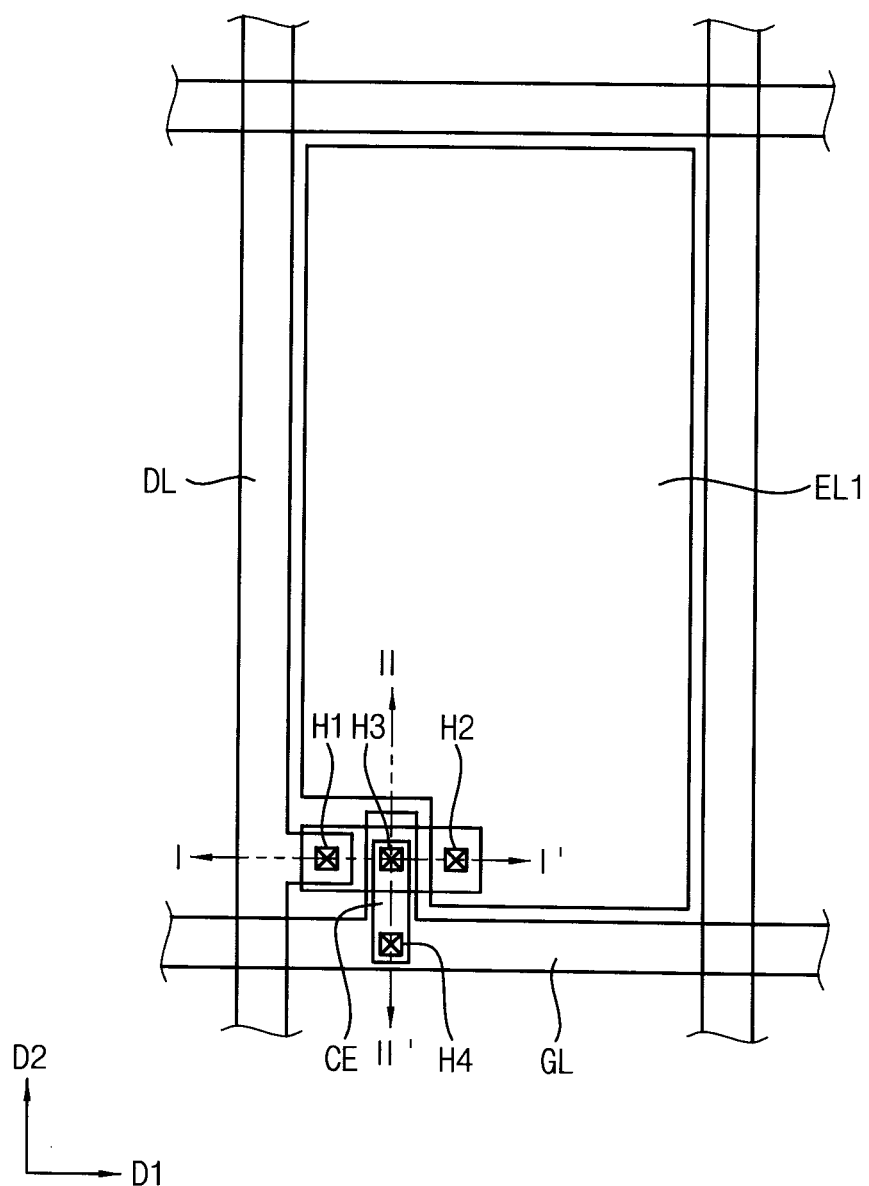
Figure 12B:
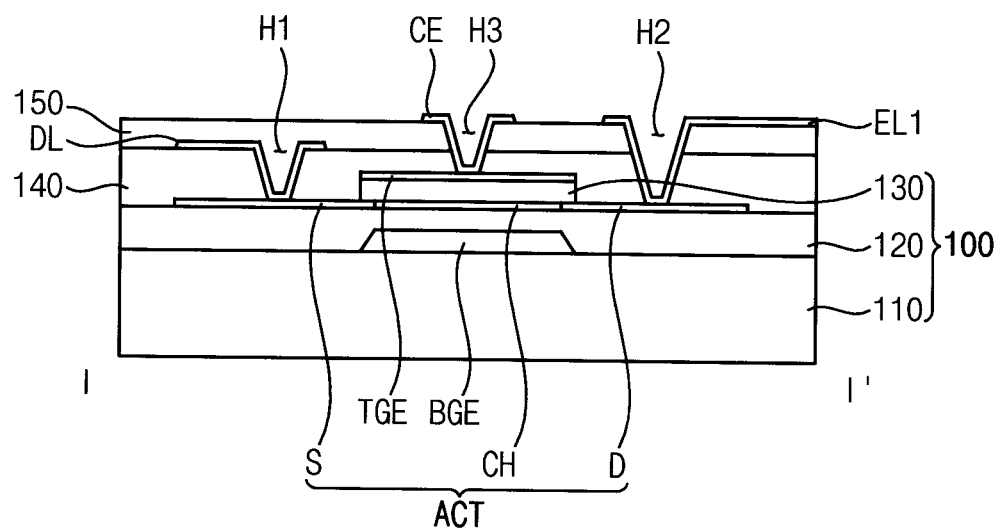
Figure 12C:
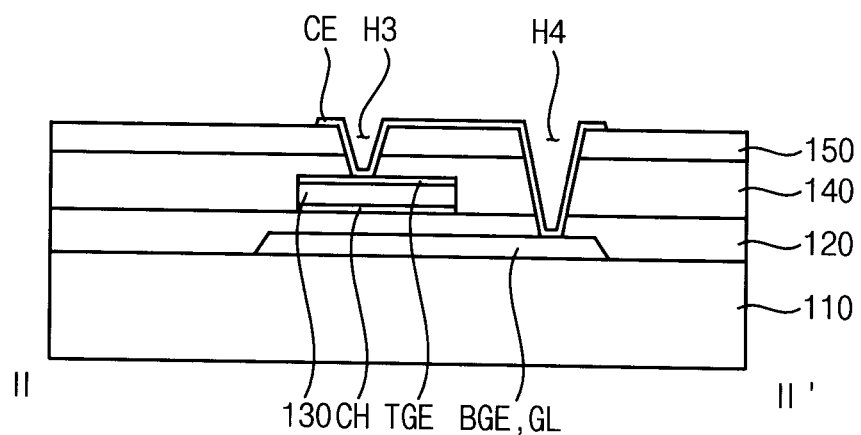

Referring to FIGS. 12A to 12C, a fourth insulation layer 150 is formed on the third insulation layer 140 on which the data line DL is formed. The fourth insulation layer 150 may include an inorganic or organic material. When the fourth insulation layer 150 includes an inorganic material, the fourth insulation layer 150 may include, for example, silicon oxide (SiOx) and/or silicon nitride (SiNx). In addition, the fourth insulation layer 150 may include, for example, a plurality of layers including materials different from each other.

The fourth insulation layer 150 may be formed by, for example, a spin coating process, a chemical vapor deposition (CVD) process, a plasma enhanced chemical vapor deposition (PECVD) process, a high density plasma-chemical vapor deposition (HDP-CVD) process, a printing process, etc.

A second contact hole H2 is formed through the fourth insulation layer 150 and the third insulation layer 140. The second contact hole H2 exposes the drain portion D of the active pattern ACT.

A third contact hole H3 is formed through the fourth insulation layer 150 and the third insulation layer 140. The third contact hole H3 exposes the top gate electrode TGE.

A fourth contact hole H4 is formed through the fourth insulation layer 150, the third insulation layer 140 and the first insulation layer 120. The fourth contact hole H4 exposes a portion of the gate line GL.

A transparent conductive layer is formed on the fourth insulation layer 150 through which the second to fourth contact holes H2, H3 and H4 are formed. The transparent conductive layer may include, for example, a transparent conductive material. For example, the transparent conductive layer may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the transparent conductive layer may further include titanium (Ti) and/or molybdenum titanium (MoTi).

A first electrode EL1 and a connecting electrode CE are formed by patterning the transparent conductive layer. For example, a photoresist composition is coated on the transparent conductive layer. A photoresist pattern corresponding to the first electrode EL1 and the connecting electrode CE is formed. Thereafter, the transparent conductive layer, which is not covered by the photoresist pattern, is etched to form the first electrode EL1 and the connecting electrode CE.

The connecting electrode CE is electrically connected to the top gate electrode TGE through the third contact hole H3.

In addition, the connecting electrode CE is electrically connected to the gate line GL through the fourth contact hole H4. The first electrode EL1 is electrically connected to the drain portion D of the active pattern ACT through the second contact hole H2.

Figure 13:
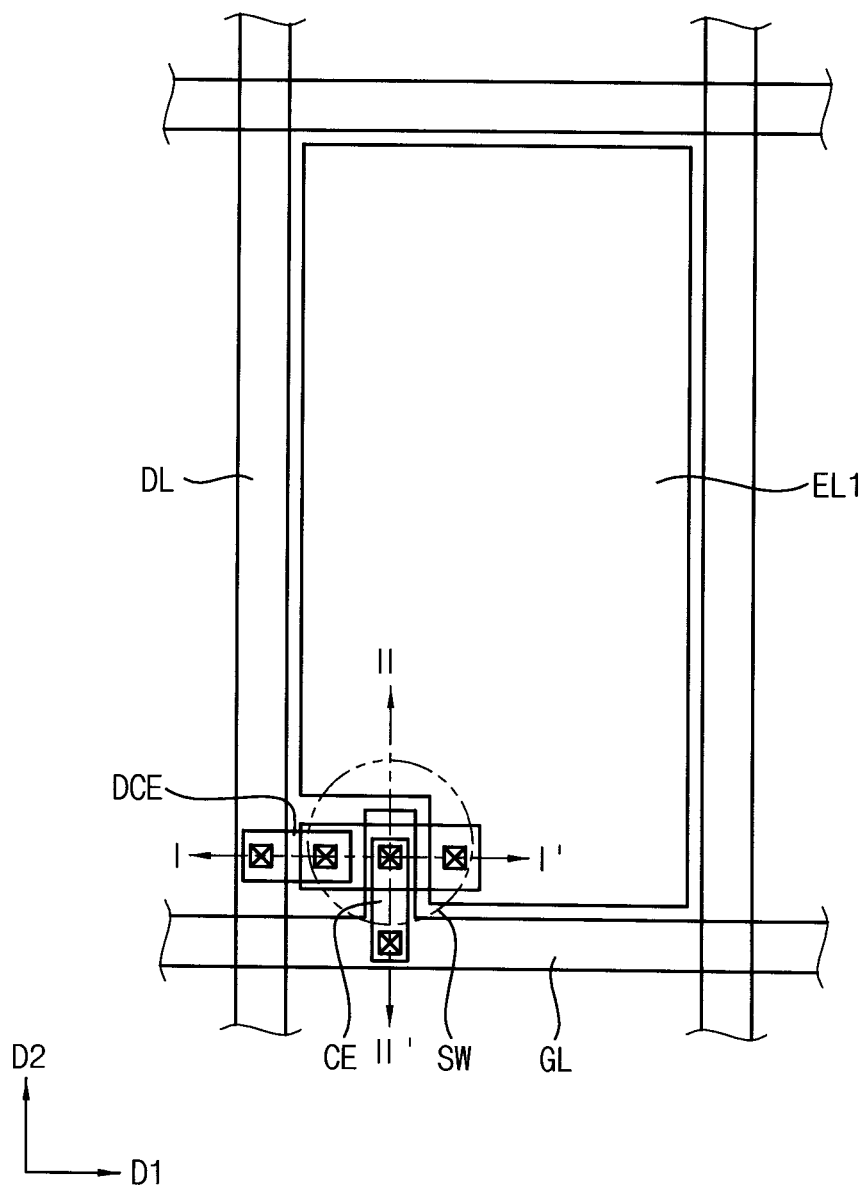
FIG. 13 is a plan view of a display panel according to an exemplary embodiment of the invention.

FIG. 13 is a plan view of an array substrate of a display panel according to an exemplary embodiment of the invention.

Referring to FIG. 13, the display panel includes, for example, a gate line GL, a data line DL, a thin film transistor SW and a first electrode EL1.

The gate line GL extends along a first direction D1. The data line DL extends along a second direction D2 substantially perpendicular to the first direction D1, and crosses the gate line GL but exemplary embodiments of the present invention are not limited thereto. For example, alternatively, in an embodiment, the data line DL may extend along the first direction D1 and the gate line GL may extend along the second direction D2 substantially perpendicular to the first direction D1, and cross the data line DL.

The gate line GL and the data line DL defines a pixel area. Although only one pixel area is generally described in the figures, the display substrate according to the exemplary embodiments generally includes a large number of pixel units respectively formed in respective pixel areas. The pixel areas are typically arrayed for example as a regular matrix structure having a plurality of rows and columns. The pixel areas typically have the same basic and repeated structures (although some variation for example in color of color filter portion or size or shape of pixel-electrode may occur), so that only one pixel area will be described herein as an example. Although the pixel area has a rectangular shape in the figures, the pixel area may have various modifications in size and/or shape and/or number of field altering slits or other fine features included therein. For example the pixel areas may have V or Z shapes.

The thin film transistor SW includes, for example, a bottom gate electrode, an active pattern including source, channel and drain portions, and a top gate electrode (refers to FIGS. 12A and 12B). The thin film transistor SW is electrically connected to the gate line GL through a connecting electrode CE, is electrically connected to the data line DL through a connecting electrode CE, and is electrically connected to the first electrode EL1.

The first electrode EL1 is formed in the pixel area. The first electrode EL1 may include, for example, a transparent conductive material. For example, the first electrode EL1 may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the first electrode EL1 may further include, for example, titanium (Ti) and/or molybdenum titanium (MoTi).

Figure 14A:
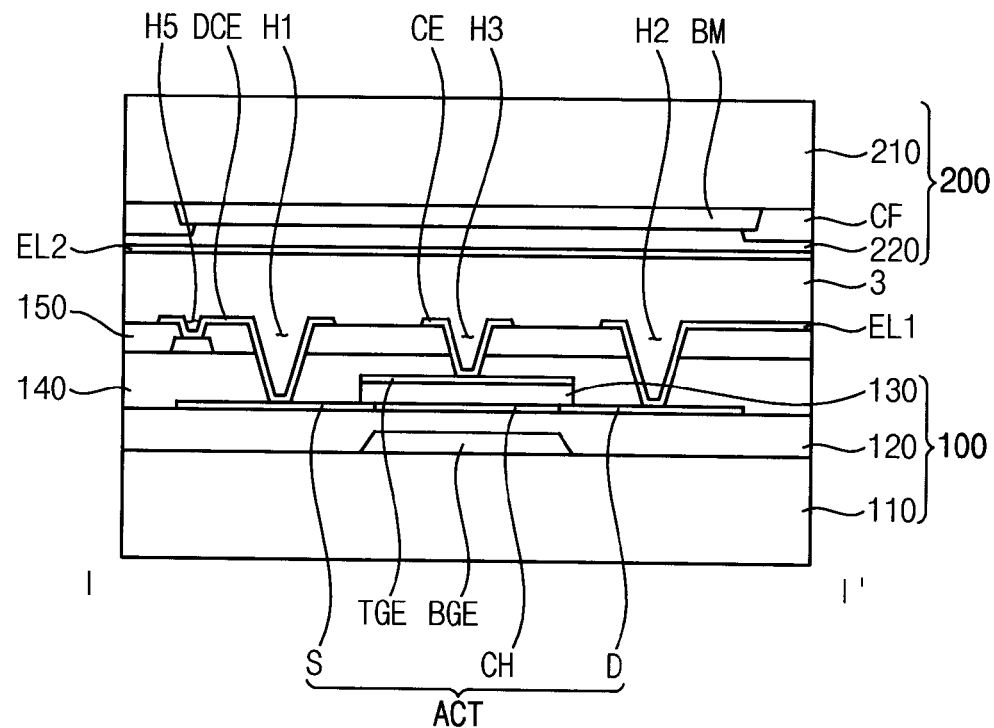
FIG. 14A is a cross-sectional view of a d'splay panel including the array substrate taken along line I-I' of FIG. 13.
Figure 14B:
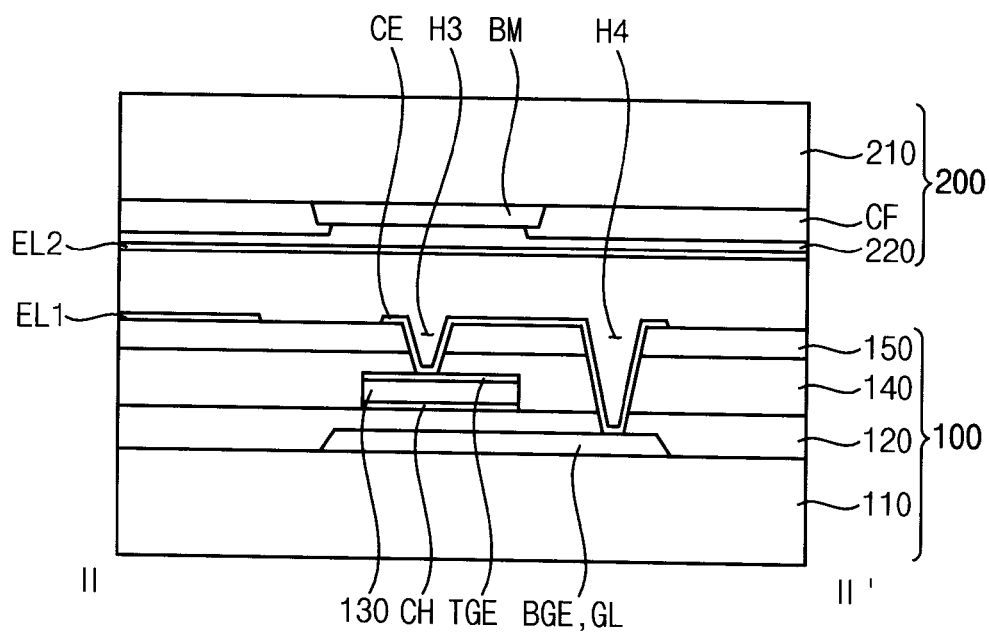
FIG. 14B is a cross-sectional view of a display panel including the array substrate taken along line II-II' of FIG. 13.

FIG. 14A is a cross-sectional view of a display panel including the array substrate taken along line I-I' of FIG. 13. FIG. 14B is a cross-sectional view of a display panel including the array substrate taken along line II-II' of FIG. 13.

Referring to FIGS. 14A and 14B, the display panel includes, for example, an array substrate 100, an opposite substrate 200 facing the array substrate 100 and a liquid crystal layer 3 disposed between the array substrate 100 and the opposite substrate 200.

The array substrate 100 includes, for example, a first substrate 110, a bottom gate electrode BGE, a gate line GL, a first insulation layer 120, an active pattern ACT, a second insulation pattern 130, a top gate electrode TGE, a third insulation layer 140, a data line DL, a fourth insulation layer 150, a connecting electrode CE and a first electrode EL1.

The first substrate 110 is a transparent insulation substrate. For example, the first substrate 110 may include a glass substrate, a quartz substrate, a silicon substrate, a plastic substrate or the like. For example, in an exemplary embodiment, the substrate 110 may be a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The bottom gate electrode BGE and the gate line GL electrically connected to the bottom gate electrode BGE are disposed on the first substrate 110. The bottom gate electrode BGE may include, for example, an opaque metal such as copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the bottom gate electrode BGE may have, for example, a multi layer structure having a plurality of layers including materials different from each other.

The first insulation layer 120 is disposed on the substrate 110 on which the bottom gate electrode BGE and the gate line GL is disposed. The first insulation layer 120 covers and insulates the bottom gate electrode BGE. The first insulation layer 120 may include an inorganic or organic material. When the first insulation layer 120 includes an inorganic material, the first insulation layer 120 may include, for example, silicon oxide (SiOx) and/or silicon nitride (SiNx). In addition, the first insulation layer 120 may include, for example, a plurality of layers including materials different from each other.

The active pattern ACT is disposed on the first insulation layer 120. The active pattern ACT may have a sufficient light transmittance.

The active pattern ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active pattern ACT may include indium gallium zinc oxide (IGZO), and may have a thickness of 500 Å.

In addition, although the active pattern ACT includes an oxide semiconductor in the present exemplary embodiment of the present invention, it is noted that exemplary embodiments of the present invention are not limited thereto. For example, in an exemplary embodiment, the active pattern ACT may include amorphous silicon (a-Si:H) and an ohmic contact layer consisting of n+ amorphous silicon (n+ a-Si:H). In this case, the active pattern ACT may have relatively small thickness to secure a sufficient light transmittance. For example, the active pattern ACT may have thickness of about 100 Å.

The active pattern ACT includes, for example, a channel portion CH, a source portion S and a drain portion D. The channel portion CH overlaps the bottom gate electrode BGE. The source portion S is adjacent to the channel portion CH, and disposed on a same plane as the channel portion CH. The drain portion D is adjacent to the channel portion CH and disposed on the same plane as the channel portion CH. A boundary shape of the channel portion CH may be, for example, substantially coincident with a boundary shape of the bottom gate electrode BGE. Thus, a boundary line in which the source or drain portion S or D and the channel portion CH contact each other may be substantially coincident with the boundary of the bottom gate electrode BGE.

The second insulation pattern 130 is disposed on the channel portion CH of the active pattern ACT. A boundary shape of the second insulation pattern 130 may be, for example, substantially coincident with the boundary shape of the channel portion CH of the active pattern ACT. The second insulation pattern 130 may include an inorganic or organic material. When the second insulation pattern 130 includes an inorganic material, the second insulation pattern 130 may include, for example, silicon oxide (SiOx) and/or silicon nitride (SiNx). In addition, the second insulation pattern 130 may include a plurality of layers including materials different from each other.

The top gate electrode TGE is disposed on the second insulation pattern 130. A boundary shape of the top gate electrode TGE is, for example, substantially coincident with the boundary shape of the second insulation pattern 130. Thus, the top gate electrode TGE and the second insulation pattern 130 have the same shapes as each other in a plan view. In addition, the boundary shape of the top gate electrode TGE may be, for example, substantially coincident with the boundary shape of the bottom gate electrode BGE. Thus, the top gate electrode TGE and the bottom gate electrode BGE have the same shapes as each other in a plan view. The top gate electrode TGE includes, for example, a transparent conductive oxide (TCO). For example, the top gate electrode TGE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

The bottom gate electrode BGE, the source portion S, the active pattern ACT including the drain portion D and the channel portion CH, and the top gate electrode TGE form the thin film transistor. (refers to SW of FIG. 13) The thin film transistor may be operated as a double gate type transistor, so that effective mobility may be increased in comparison to a traditional structure.

In addition, the boundary shape of the bottom gate electrode BGE and the boundary shape of the top gate electrode TGE may be, for example, substantially coincident with each other and may be substantially the same as each other. Thus, the top or bottom gate electrode TGE or BGE does not overlap the source portion S or the drain portion D of the active pattern ACT, so that a parasitic capacitance which is formed by overlapping a source or drain electrode and a gate electrode may be decreased.

The boundary shape of the bottom gate electrode BGE and the top gate electrode TGE may be, for example, substantially coincident with each other. A difference between the boundary of the bottom gate electrode BGE and the boundary of the top gate electrode TGE in a plan view, such as a miss-align distance between the bottom gate electrode BGE and the top gate electrode TGE is defined as a skew. When a deviation of the skew is defined as a value of the smallest skew subtracted from the biggest skew, the deviation of the skew may be less than about 3 μm (micrometer). In an embodiment, the deviation of the skew may be, for example, less than about 0.5 μm.

The third insulation layer 140 is disposed on the top gate electrode TGE and the active pattern ACT. The third insulation layer 140 covers and insulates the top gate electrode TGE and the source portion S and the drain portion D of the active pattern ACT. The third insulation layer 140 may include an inorganic or organic material. When the third insulation layer 140 includes an inorganic material, the third insulation layer 140 may include, for example, silicon oxide (SiOx) and/or silicon nitride (SiNx). In addition, the third insulation layer 140 may include, for example, a plurality of layers including materials different from each other.

The data line DL is disposed on the third insulation layer 140. The data line DL may have, for example, a single layer structure including copper (Cu), silver (Ag), chromium (Cr), molybdenum (Mo), aluminum (Al), titanium (Ti), manganese (Mn), nickel (Ni), gold (Au), palladium (Pd), platinum (Pt), neodymium (Nd), beryllium (Be), niobium (Nb), iron (Fe), selenium (Se), tantalum (Ta), cobalt (Co), and a mixture thereof. In addition, the data line DL may have, for example, a multi layer structure having a plurality of layers including materials different from each other.

The fourth insulation layer 150 is disposed on the third insulation layer 140 on which the data line DL is disposed. The fourth insulation layer 150 may include, for example, an inorganic or organic material. When the fourth insulation layer 150 includes an inorganic material, the fourth insulation layer 150 may include, for example, silicon oxide (SiOx) and/or silicon nitride (SiNx). In addition, the fourth insulation layer 150 may include, for example, a plurality of layers including materials different from each other.

A first contact hole H1 is formed through the fourth insulation layer 150 and the third insulation layer 140. The first contact hole H1 exposes the source portion S of the active pattern ACT.

A second contact hole H2 is formed through the fourth insulation layer 150 and the third insulation layer 140. The second contact hole H2 exposes the drain portion D of the active pattern ACT.

A third contact hole H3 is formed through the fourth insulation layer 150 and the third insulation layer 140. The third contact hole H3 exposes the top gate electrode TGE.

A fourth contact hole H4 is formed through the fourth insulation layer 150, the third insulation layer 140 and the first insulation layer 120. The fourth contact hole H4 exposes a portion of the gate line GL.

A fifth contact hole H5 is formed through the fourth insulation layer 150. The fifth contact hole H5 exposes a portion of the data line DL.

The data connecting electrode DCE is disposed on the fourth insulation layer 150. The data connecting electrode DCE is electrically connected to the source portion S of the active pattern ACT through the first contact hole H1. In addition, the data connecting electrode DCE is electrically connected to the data line DL through the fifth contact hole H5. The data connecting electrode DCE includes, for example, a transparent conductive material. For example, the data connecting electrode DCE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

In addition, the data connecting electrode DCE may further include, for example, titanium (Ti) and/or molybdenum titanium (MoTi).

The connecting electrode CE is disposed on the fourth insulation layer 150. The connecting electrode CE is electrically connected to the top gate electrode TGE through the third contact hole H3. In addition, the connecting electrode CE is electrically connected to the gate line GL through the fourth contact hole H4. Thus, the connecting electrode CE may apply a gate signal applied to the connecting electrode CE to the top gate electrode TGE. The connecting electrode CE includes, for example, a transparent conductive material. For example, the connecting electrode CE may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the connecting electrode CE may further include, for example, titanium (Ti) and/or molybdenum titanium (MoTi).

The first electrode EL1 is disposed on the fourth insulation layer 150. The first electrode EL1 is electrically connected to the drain portion D of the active pattern ACT through the second contact hole H2. The first electrode EL1 includes, for example, a transparent conductive material. For example, the first electrode EL1 may include indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). In addition, the first electrode EL1 may further include, for example, titanium (Ti) and/or molybdenum titanium (MoTi).

The data connecting electrode DCE, the connecting electrode CE and the first electrode EL1 may include, for example, the same material as each other.

According to exemplary embodiments of the present invention, a thin film transistor includes a top gate electrode and a channel portion of an active pattern which are self aligned by a back exposure using a bottom gate electrode as a mask. Thus, a parasitic capacitance between source and drain portions of the active pattern and the bottom and top gate electrodes may be decreased. Consequently, an effective mobility of the display panel may be increased.

In addition, a method of manufacturing a display panel according to exemplary embodiments of the present invention includes forming a top gate layer including a transparent conductive material, and then forming the top gate electrode and the channel portion of the active pattern which are self aligned by a back exposure using a bottom gate electrode as a mask having an opaque metal. Thus, a boundary of the bottom gate electrode and a boundary of the top gate electrode may be substantially coincident with each other in a cross-sectional view.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:
1. A thin film transistor comprising:
   a bottom gate electrode;

a top gate electrode comprising a transparent conductive material and overlapping with the bottom gate electrode; and an active pattern comprising a source portion, a drain portion and a channel portion disposed between the source portion and the drain portion, wherein the channel portion overlaps with the bottom gate electrode and the top gate electrode, wherein the top gate electrode and the bottom gate electrode start in a same location relative to a first direction and end in a same location relative to the first direction, and wherein the top gate electrode and the channel portion start in a same location relative to a second direction, which is different from the first direction, and end in a same location relative to the second direction.

2. The thin film transistor of claim 1, wherein the bottom gate electrode comprises an opaque metal.

3. The thin film transistor of claim 2, wherein the active pattern is transparent.

4. The thin film transistor of claim 2, wherein the active pattern comprises an oxide semiconductor, and wherein the source and drain portions are deoxidized portions of the oxide semiconductor.

5. The thin film transistor of claim 4, wherein a thickness of the active pattern is about 500 Å.

6. The thin film transistor of claim 3, wherein the active pattern comprises an amorphous silicon, and wherein a thickness of the active pattern is about 100 Å.

7. The thin film transistor of claim 1, further comprising:
a substrate on which the bottom gate electrode is disposed;
a first insulation layer disposed between the bottom gate electrode and the active pattern, wherein the first insulation layer is configured to insulate the bottom gate electrode; and
a second insulation pattern disposed between the active pattern and the top gate electrode, wherein the second insulation pattern is configured to insulate the top gate electrode.

8. The thin film transistor of claim 7, wherein a boundary line of the second insulation pattern is substantially the same as a boundary line of the top gate electrode in a plan view.

9. The thin film transistor of claim 1, wherein a boundary line between the channel portion and the source portion and a boundary line between the channel portion and the drain portion are substantially coincident with a boundary line of the bottom gate electrode.

10. The thin film transistor of claim 1, wherein a deviation of a skew is less than about 0.5 μm,
wherein the skew is defined as a miss-align distance between the bottom gate electrode and the top gate electrode, and
wherein the deviation of the skew is defined as a value of a smallest skew subtracted from a biggest skew.

11. A display panel comprising:
a gate line;
a data line crossing the gate line;
a first electrode disposed in a pixel area which is defined by the gate line and the data line; and
a thin film transistor electrically connected to the gate line, the data line and the first electrode,
wherein the thin film transistor comprises:
a bottom gate electrode electrically connected to the gate line,
a top gate electrode comprising a transparent conductive material and overlapping with the bottom gate electrode, and an active pattern comprising a source portion electrically connected to data line, a drain portion electrically connected to the first electrode and a channel portion disposed between the source portion and the drain portion, wherein the channel portion overlaps with the bottom gate electrode and the top gate electrode, further comprising a connecting electrode which electrically connects the top gate electrode to the gate line, wherein the connecting electrode comprising a same material as the first electrode.

12. The display panel of claim 11, wherein the bottom gate electrode comprises an opaque metal, wherein the active pattern is transparent and comprises an oxide semiconductor, and wherein the source and drain portions of the active pattern are deoxidized portions of the oxide semiconductor.

13. The display panel of claim 12, further comprising:
a substrate on which the gate line and the bottom gate electrode are disposed;
a first insulation layer disposed between the bottom gate electrode and the active pattern, wherein the first insulation layer is configured to insulate the bottom gate electrode;
a second insulation pattern disposed between the active pattern and the top gate electrode, wherein the second insulation pattern is configured to insulate the top gate electrode;
a third insulation layer disposed on the thin film transistor, wherein the third insulation layer is configured to insulate thin film transistor; and
a fourth insulation layer disposed on the third insulation layer, wherein the data line is disposed between the third insulation layer and the fourth insulation layer.

14. The display panel of claim 11, wherein a first contact hole is disposed through the third insulation layer, a second contact hole disposed through the third insulation layer and the fourth insulation layer, a third contact hole disposed through the third insulation layer and the fourth insulation layer, a fourth contact hole disposed through the first insulation layer, the third insulation layer and the fourth insulation layer, wherein the data line is electrically connected to the source portion of the active pattern through the first contact hole, wherein the first electrode is electrically connected to the drain portion of the active pattern through the second contact hole, and wherein the connecting electrode is electrically connected to the top gate electrode through the third contact hole, and electrically connected to the gate line through the fourth contact hole.

15. The display panel of claim 11, wherein a deviation of a skew is less than about 0.5 μm, wherein the skew is defined as a miss-align distance between the bottom gate electrode and the top gate electrode, and wherein the deviation of the skew is defined as a value of a smallest skew subtracted from a biggest skew.

16. A method of manufacturing a thin film transistor comprising:
forming a bottom gate electrode on a substrate, wherein the bottom gate electrode comprises an opaque metal;
forming a first insulation layer on the substrate on which the bottom gate electrode is formed;
sequentially forming an active layer, a second insulation layer and a top gate layer on the first insulation layer, wherein the top gate layer comprises a transparent conductive material;
forming a photoresist pattern corresponding to the bottom gate electrode, wherein the forming the photoresist pattern comprises:
coating a photoresist composition on the top gate layer, and applying a back exposure to the photoresist composition, wherein the back exposure includes irradiating light in a direction from the substrate to the photoresist composition; and forming a top gate electrode and a second insulation pattern by etching a portion of the top gate layer and a portion of the second insulation layer which are not covered by the photoresist pattern, and wherein portions of the active layer are exposed by the forming of the top gate electrode and the second insulation pattern, wherein the top gate electrode and the bottom gate electrode start in a same location relative to a first direction and end in a same location relative to the first direction, and wherein the top gate electrode and the channel portion start in a same location relative to a second direction, which is different from the first direction, and end in a same location relative to the second direction.

17. The method of claim 16, wherein the active layer comprises an oxide semiconductor, and the method further comprises forming a source portion and a drain portion by deoxidizing the portions of the active layer which are exposed.

18. A method of manufacturing a display panel comprising:
forming a bottom gate electrode and a gate line on a substrate;
forming a first insulation layer on the substrate on which the bottom gate electrode and the gate line are formed;
sequentially forming an active layer, a second insulation layer and a top gate layer on the first insulation layer, wherein the active layer comprises an oxide semiconductor, wherein the top gate layer comprises a transparent conductive material;
forming a first photoresist pattern corresponding to an active pattern on the top gate layer;
forming a preliminary top gate electrode, a preliminary second insulation pattern and an active pattern by etching the top gate layer, the second insulation layer and the active layer using the first photoresist pattern;
forming a second photoresist pattern corresponding to the bottom gate electrode, wherein the forming the second photoresist pattern comprises: coating a photoresist composition on the preliminary top gate electrode, and applying a back exposure to the photoresist composition, wherein the back exposure includes irradiating light in a direction from the substrate to the photoresist composition;
forming a top gate electrode and a second insulation pattern by etching a portion of the preliminary top gate electrode and a portion of the preliminary second insulation pattern which are not covered by the second photoresist pattern, and wherein portions of the active pattern are exposed by the forming of the top gate electrode and the second insulation pattern;
forming a source portion and a drain portion by deoxidizing the portions of the active pattern which are exposed; and
forming a third insulation layer on the first insulation layer on which the top gate electrode and the active pattern are formed.

19. The method of claim 18, further comprising:
forming a first contact hole through the third insulation layer, wherein the first contact hole exposes the source portion of the active pattern;
forming a data line on the third insulation layer, wherein the data line is electrically connected to the source electrode of the active pattern through the first contact hole;
forming a fourth insulation layer on the third insulation layer on which the data line is formed;
forming a second contact hole through the fourth insulation layer and the third insulation layer, wherein the second contact hole exposes the drain portion of the active pattern;
forming a third contact hole through the fourth insulation layer and the third insulation layer, wherein the third contact hole exposes the top gate electrode;
forming a fourth contact hole through the fourth insulation layer, the third insulation layer and the first insulation layer, wherein the fourth contact hole exposes the gate line; and
forming a first electrode and a connecting electrode on the fourth insulation layer, wherein the first electrode is electrically connected to the drain portion of the active pattern through the second contact hole, and wherein the connecting electrode is electrically connected to the top gate electrode through the third contact hole, and is electrically connected to the gate line through the fourth contact hole.

* * * * *